US010408907B2

(12) United States Patent
Zho

(10) Patent No.: US 10,408,907 B2
(45) Date of Patent: Sep. 10, 2019

(54) MAGNETIC RESONANCE IMAGING APPARATUS AND METHOD OF OBTAINING MAGNETIC RESONANCE IMAGE BY USING MULTIPLE EXCITATION WITH DELAYED SPIN-ECHOES

(71) Applicant: SAMSUNG ELECTRONICS CO., LTD., Suwon-si (KR)

(72) Inventor: Sang-young Zho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 200 days.

(21) Appl. No.: 15/372,941

(22) Filed: Dec. 8, 2016

(65) Prior Publication Data

US 2017/0242087 A1    Aug. 24, 2017

(30) Foreign Application Priority Data

Feb. 19, 2016    (KR) ........................ 10-2016-0019784

(51) Int. Cl.
  *G01R 33/26*    (2006.01)
  *G01R 33/561*   (2006.01)
  *G01R 33/54*    (2006.01)

(52) U.S. Cl.
  CPC ..... *G01R 33/5618* (2013.01); *G01R 33/5617* (2013.01); *G01R 33/543* (2013.01)

(58) Field of Classification Search
  CPC ...... G01R 33/26; G01R 33/032; G01R 33/24; G01R 33/3415; G01R 33/3692; G01R 33/36; G01R 33/546

(Continued)

(56) References Cited

U.S. PATENT DOCUMENTS 5,225,781 A * 7/1993 Glover ................. G01R 33/485
                                                         324/309
5,510,713 A * 4/1996 Bernstein ........... G01R 33/4838
                                                         324/307

(Continued)

FOREIGN PATENT DOCUMENTS

JP          3683962 B2    8/2005
JP       2009201934 A     9/2009

(Continued)

OTHER PUBLICATIONS

Communication dated Mar. 31, 2017, issued by the International Searching Authority in counterpart International Application No. PCT/KR2016/014694 (PCT/ISA/210 & PCT/ISA/237).

(Continued)

*Primary Examiner* — Patrick Assouad
*Assistant Examiner* — Taqi R Nasir
(74) *Attorney, Agent, or Firm* — Sughrue Mion, PLLC

(57) ABSTRACT

A magnetic resonance imaging (MRI) apparatus, including a radio frequency (RF) transmitter configured to transmit a plurality of excitation RF pulses to an object, and to transmit a refocusing RF pulse to the object within a repetition time (TR) period after transmitting the plurality of excitation RF pulses; and a controller configured to control the RF transmitter to transmit a plurality of first additional gradient magnetic fields corresponding to the plurality of excitation RF pulses in order to spoil a plurality of free induction decay (FID) signals produced by the plurality of excitation RF pulses, and to transmit a plurality of second additional gradient magnetic fields corresponding to the plurality of excitation RF pulses in order to generate a plurality of spin echo signals corresponding to the spoiled plurality of FID signals; and an RF receiver configured to acquire the generated plurality of spin echo signals.

18 Claims, 20 Drawing Sheets

(58) Field of Classification Search
USPC .................. 324/300, 301, 302, 304
See application file for complete search history.

(56) References Cited

U.S. PATENT DOCUMENTS

| | | | |
|---|---|---|---|
| 5,528,145 A * | 6/1996 | Hirata | G01R 33/5615 |
| | | | 324/307 |
| 5,749,834 A | 5/1998 | Hushek | |
| 5,757,188 A * | 5/1998 | Miyazaki | G01R 33/4828 |
| | | | 324/309 |
| 6,483,305 B1 | 11/2002 | Miyamoto | |
| 6,498,485 B2 * | 12/2002 | Miyosi | G01R 33/56518 |
| | | | 324/307 |
| 6,781,372 B2 * | 8/2004 | Shah | G01R 33/482 |
| | | | 324/307 |
| 7,148,686 B2 * | 12/2006 | Asano | G01R 33/4828 |
| | | | 324/309 |
| 7,420,368 B2 * | 9/2008 | Miyazaki | G01R 33/4828 |
| | | | 324/307 |
| 8,310,234 B2 * | 11/2012 | Deshpande | G01R 33/5607 |
| | | | 324/300 |
| 9,581,670 B2 | 2/2017 | Stemmer | |
| 2008/0084206 A1 | 4/2008 | Miyoshi | |
| 2008/0319301 A1 | 12/2008 | Busse | |
| 2009/0278538 A1 | 11/2009 | Chen et al. | |
| 2010/0171499 A1 | 7/2010 | Sharp et al. | |
| 2013/0181714 A1 | 7/2013 | Umeda | |
| 2013/0249548 A1 * | 9/2013 | Stemmer | G01R 33/4835 |
| | | | 324/309 |
| 2015/0002148 A1 | 1/2015 | Liu | |
| 2015/0002149 A1 * | 1/2015 | Nehrke | G01R 33/243 |
| | | | 324/309 |

FOREIGN PATENT DOCUMENTS

| | | |
|---|---|---|
| JP | 2013-163012 A | 8/2013 |
| JP | 2014-147756 A | 8/2014 |
| KR | 2001-0067080 A | 7/2001 |
| KR | 10-2013-0099612 A | 9/2013 |
| KR | 101418170 B1 | 7/2014 |
| KR | 101475932 B1 | 12/2014 |
| WO | 2015086415 A1 | 6/2015 |

OTHER PUBLICATIONS

Communication dated Apr. 25, 2017, issued by the Korean Intellectual Property Office in counterpart Korean Application No. 10-2016-0019784.

Communication issued by the Korean Intellectual Property Office dated Aug. 22, 2017 in counterpart Korean Patent Application No. 10-2016-0019784.

Communication dated Feb. 14, 2019, from the European Patent Office in counterpart European Application No. 16890768.1.

* cited by examiner

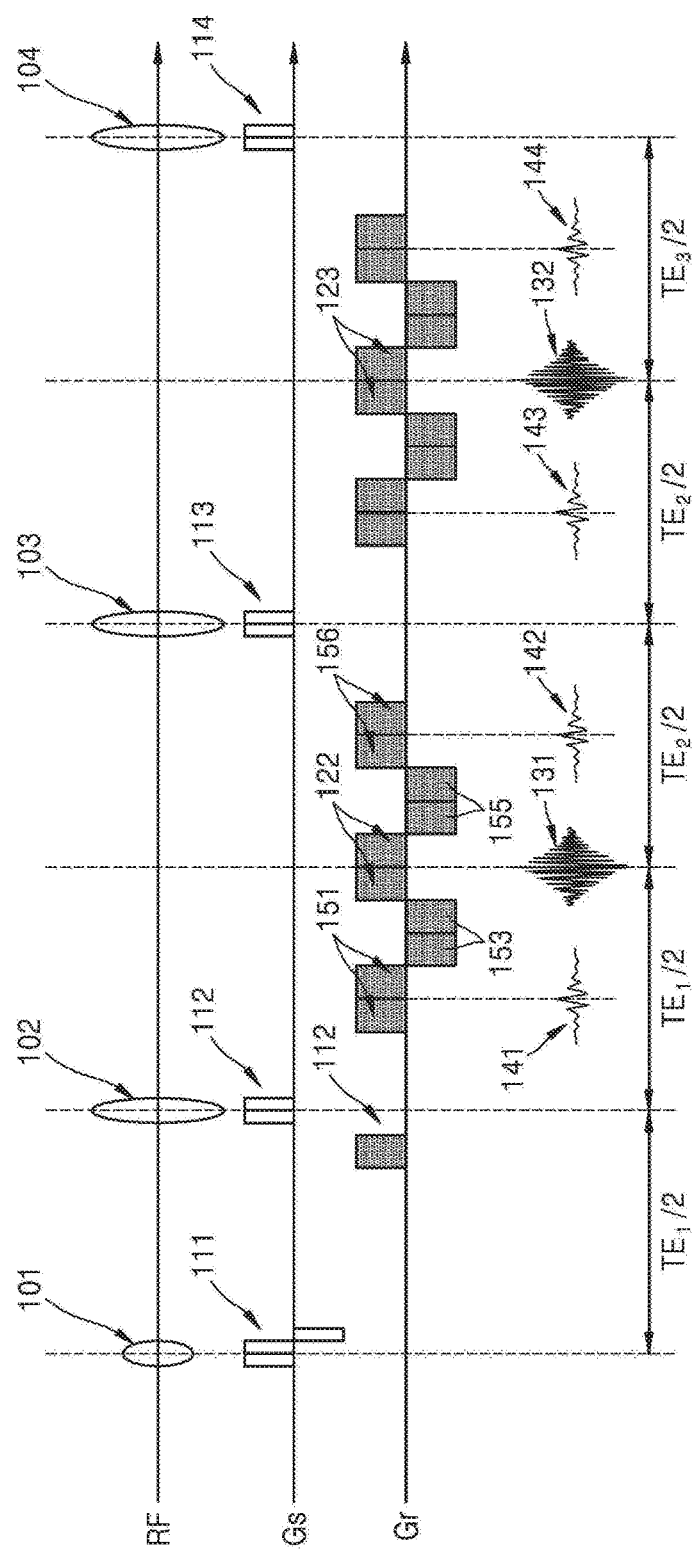

MAGNETIC RESONANCE IMAGING APPARATUS AND METHOD OF OBTAINING MAGNETIC RESONANCE IMAGE BY USING MULTIPLE EXCITATION WITH DELAYED SPIN-ECHOES

CROSS-REFERENCE TO RELATED APPLICATION

This application claims benefit from Korean Patent Application No. 10-2016-0019784, filed on Feb. 19, 2016, in the Korean Intellectual Property Office, the disclosure of which is incorporated herein in its entirety by reference.

BACKGROUND

1. Field

The present disclosure relates to methods and apparatuses for acquiring a spin echo signal by using a radio frequency (RF) pulse and a gradient magnetic field.

2. Description of Related Art

A magnetic resonance imaging (MRI) system may be an apparatus for acquiring a sectional image of a part of an object by expressing, via a contrast comparison, a strength of a magnetic resonance (MR) signal with respect to a RF signal generated in a magnetic field having a specific strength. For example, if an RF pulse that resonates only a specific atomic nucleus (for example, a spinning nucleus) is emitted for an instant toward the object placed in a strong magnetic field and then the emission stops, an MR signal is emitted from the specific atomic nucleus, and thus, the MRI system may receive the MR signal and obtain an MR image. The MR signal may denote an RF signal emitted from the object. An intensity of the MR signal may be determined according to a density of a predetermined atom (for example, hydrogen) in the object, a T1 relaxation time, a T2 relaxation time, a flow of blood, or the like.

MRI systems have characteristics different from those of other imaging apparatuses. Unlike imaging apparatuses such as computed tomography (CT) apparatuses that acquire images according to a direction of detecting hardware, MRI systems may acquire 2D images or 3D volume images oriented toward an optional point. MRI systems do not expose objects or examiners to radiation, unlike CT apparatuses, X-ray apparatuses, position emission tomography (PET) apparatuses, and single photon emission CT (SPECT) apparatuses, may obtain images having high soft tissue contrast, and may also acquire neurological images, intravascular images, musculoskeletal images, and oncologic images that are required to clearly show abnormal tissues.

SUMMARY

Provided are magnetic resonance imaging (MRI) apparatuses and methods, whereby a large number of spin echo signals may be acquired within one repetition time (TR) period.

Provided are MRI apparatuses and methods, whereby a large number of spin echo signals may be acquired by using a small number of radio frequency (RF) pulses.

Provided are MRI apparatuses and methods, whereby a spin echo signal may be acquired at the desired time.

Additional aspects will be set forth in part in the description which follows and, in part, will be apparent from the description, or may be learned by practice of the presented exemplary embodiments.

According to an aspect of an exemplary embodiment, a magnetic resonance imaging (MRI) apparatus includes a radio frequency (RF) transmitter configured to transmit a plurality of excitation RF pulses to an object, and to transmit a refocusing RF pulse to the object within a repetition time (TR) period after transmitting the plurality of excitation RF pulses; and a controller configured to control the RF transmitter to transmit to the object a plurality of first additional gradient magnetic fields corresponding to the plurality of excitation RF pulses in order to spoil a plurality of free induction decay (FID) signals produced by the plurality of excitation RF pulses, and control the RF transmitter to transmit to the object a plurality of second additional gradient magnetic fields corresponding to the plurality of excitation RF pulses in order to generate a plurality of spin echo signals corresponding to the spoiled plurality of FID signals after transmitting the refocusing RF pulse; and an RF receiver configured to acquire the generated spin echo signals.

The plurality of excitation RF pulses may have a plurality of flip angles.

The plurality of excitation RF pulses may excite a same slice of the object.

An area of each of the plurality of first additional gradient magnetic fields may be determined based on at least one from among a thickness of a slice of the object, the slice being excited by the plurality of excitation RF pulses, and a magnitude of each of the FID signals.

The plurality of first additional gradient magnetic fields and the plurality of second additional gradient magnetic fields may be added to at least one from among a slice-selection gradient magnetic field, a phase encoding gradient magnetic field, and a frequency encoding gradient magnetic field.

The plurality of excitation RF pulses may include a_excitation RF pulse and b_excitation RF pulse, the plurality of first additional gradient magnetic fields may include a_first additional gradient magnetic field corresponding to the a_excitation RF pulse and b_first additional gradient magnetic field corresponding to the b_excitation RF pulse, and the a_first additional gradient magnetic field may have a first area, and the b_first additional gradient magnetic field may have a second area different from the first area.

After acquiring the plurality of spin echo signals, the controller may be further configured to control the RF transmitter to transmit a gradient magnetic field having a same area as each of the plurality of second additional gradient magnetic fields, wherein the gradient magnetic field has an opposite sign to each of the plurality of second additional gradient magnetic fields, in order to spoil each of the plurality of spin echo signals.

The controller may be further configured to acquire a k-space based on the plurality of spin echo signals corresponding to the plurality of FID signals produced by the plurality of excitation RF pulses, and to obtain an MR image of the object based on the acquired k-space.

The controller may be further configured to acquire a plurality of k-spaces based on the plurality of spin echo signals corresponding to the plurality of FID signals produced by the plurality of excitation RF pulses, and to obtain a plurality of MR images of the object corresponding to the acquired plurality of k-spaces.

The controller may be further configured to obtain an image of the object by combining the obtained plurality of MR images of the object.

According to a further aspect of an exemplary embodiment, a method of acquiring a spin echo signal includes transmitting a plurality of excitation RF pulses to an object; applying a refocusing radio frequency (RF) pulse to the object within a repetition time (TR) period after transmitting the plurality of excitation RF pulses; transmitting to the object a plurality of first additional gradient magnetic fields corresponding to the plurality of excitation RF pulses in order to spoil a plurality of free induction decay (FID) signals produced by the plurality of excitation RF pulses, by; and transmitting to the object a plurality of second additional gradient magnetic fields corresponding to the plurality of excitation RF pulses in order to generate a plurality of spin echo signals corresponding to the spoiled plurality of FID signals after transmitting the refocusing RF pulse.

The plurality of excitation RF pulses may have a plurality of flip angles.

The plurality of excitation RF pulses may excite a same slice of the object.

An area of each of the plurality of first additional gradient magnetic fields may be determined based on at least one from among a thickness of a slice of the object, the slice being excited by the plurality of excitation RF pulses, and a magnitude of each of the FID signals.

The plurality of first additional gradient magnetic fields and the plurality of second additional gradient magnetic fields are added to at least one from among a slice-selection gradient magnetic field, a phase encoding gradient magnetic field, and a frequency encoding gradient magnetic field.

The plurality of excitation RF pulses may include a_excitation RF pulse and b_excitation RF pulse, the plurality of first additional gradient magnetic fields may include a_first additional gradient magnetic field corresponding to the a_excitation RF pulse and b_first additional gradient magnetic field corresponding to the b_excitation RF pulse, and the a_first additional gradient magnetic field may have a first area, and the b_first additional gradient magnetic field may have a second area different from the first area.

The method may further include, after the generating of the plurality of spin echo signals, transmitting a gradient magnetic field having a same area as each of the plurality of second additional gradient magnetic fields, wherein the gradient magnetic field has an opposite sign to each of the plurality of second additional gradient magnetic fields, in order to spoil each of the plurality of spin echo signals.

The method may further include acquiring a k-space based on the plurality of spin echo signals corresponding to the plurality of FID signals produced by the plurality of excitation RF pulses; and obtaining an MR image of the object based on the acquired k-space.

The method may further include acquiring a plurality of k-spaces based on the plurality of spin echo signals corresponding to the plurality of FID signals produced by the plurality of excitation RF pulses; and obtaining a plurality of MR images of the object corresponding to the acquired plurality of k-spaces.

The method may further include obtaining an image of the object by combining the obtained plurality of MR images of the object.

BRIEF DESCRIPTION OF THE DRAWINGS

These and/or other aspects will become apparent and more readily appreciated from the following description of the exemplary embodiments, taken in conjunction with the accompanying drawings in which:

FIG. 1B is a pulse sequence schematic diagram of a GRASE sequence according to an exemplary embodiment;

DETAILED DESCRIPTION

Figure 1A:
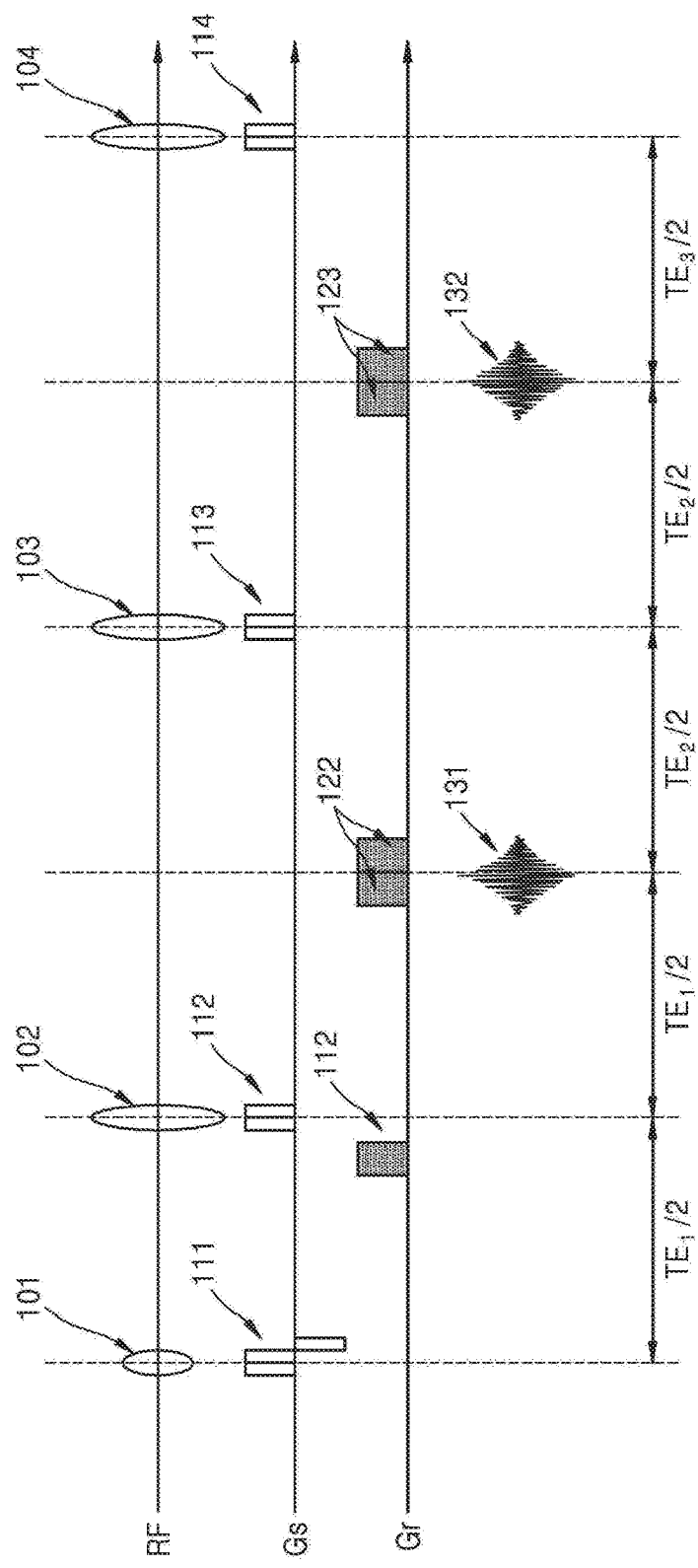
FIG. 1A illustrates a pulse sequence schematic diagram of a spin echo pulse sequence according to an exemplary embodiment.

The attached drawings for illustrating exemplary embodiments of the present disclosure are referred to in order to gain a sufficient understanding of the present disclosure, the merits thereof, and the objectives accomplished by the implementation of the present disclosure. In this regard, the present exemplary embodiments may have different forms and should not be construed as being limited to the descriptions set forth herein. Rather, these exemplary embodiments are provided so that this disclosure will be thorough and complete and will fully convey the concept of the present exemplary embodiments to one of ordinary skill in the art, and the present disclosure will only be defined by the appended claims.

Hereinafter, the terms used in the specification will be briefly described, and then the present disclosure will be described in detail.

The terms used in this specification are those general terms currently widely used in the art in consideration of functions regarding the present disclosure, but the terms may vary according to the intention of those of ordinary skill in the art, precedents, or new technology in the art. Also, some terms may be arbitrarily selected by the applicant, and in this case, the meaning of the selected terms will be described in detail in the detailed description of the present specification. Thus, the terms used herein have to be defined based on the meaning of the terms together with the description throughout the specification.

When a part "includes" or "comprises" an element, unless there is a particular description contrary thereto, the part can further include other elements, not excluding the other elements. Also, the term "unit" in the exemplary embodiments may mean a software component or hardware component such as a field-programmable gate array (FPGA) or an application-specific integrated circuit (ASIC), and performs a specific function. However, the term "unit" is not limited to software or hardware. The "unit" may be formed so as to be in an addressable storage medium, or may be formed so as to operate one or more processors. Thus, for example, the term "unit" may refer to components such as software components, object-oriented software components, class components, and task components, and may include processes, functions, attributes, procedures, subroutines, segments of program code, drivers, firmware, micro codes, circuits, data, a database, data structures, tables, arrays, or variables. A function provided by the components and "units" may be associated with the smaller number of components and "units", or may be divided into additional components and "units". As used herein, the term "and/or" includes any and all combinations of one or more of the associated listed items. Expressions such as "at least one of," when preceding a list of elements, modify the entire list of elements and do not modify the individual elements of the list.

Reference will now be made in detail to exemplary embodiments, examples of which are illustrated in the accompanying drawings. In the following description, well-known functions or constructions are not described in detail so as not to obscure the exemplary embodiments with unnecessary detail.

Throughout the specification, an "image" may mean multi-dimensional data formed of discrete image elements (e.g., pixels in a two-dimensional (2D) image and voxels in a three-dimensional (3D) image). For example, the image may be a medical image of an object captured by an X-ray apparatus, a computed tomography (CT) apparatus, a magnetic resonance imaging (MRI) apparatus, an ultrasound diagnosis apparatus, or another medical imaging apparatus.

Furthermore, in the present specification, an "object" may be a human, an animal, or a part of a human or animal. For example, the object may be an organ (e.g., the liver, the heart, the womb, the brain, a breast, or the abdomen), a blood vessel, or any combination thereof. The object may be a phantom. The phantom means a material having a density, an effective atomic number, and a volume that are approximately the same as those of an organism. For example, the phantom may be a spherical phantom having properties similar to the human body.

Furthermore, in the present specification, a "user" may be, but is not limited to, a medical expert, such as a medical doctor, a nurse, a medical laboratory technologist, or a technician who repairs a medical apparatus.

Furthermore, in the present specification, an "MR image" refers to an image of an object obtained by using the nuclear magnetic resonance principle.

Furthermore, in the present specification, a "pulse sequence" refers to continuity of signals repeatedly applied by an MRI apparatus. The pulse sequence may include a time parameter of a radio frequency (RF) pulse, for example, repetition time (TR) or echo time (TE).

Furthermore, in the present specification, a "pulse sequence schematic diagram" shows an order of events that occur in an MRI apparatus. For example, the pulse sequence schematic diagram may be a diagram showing an RF pulse, a gradient magnetic field, an MR signal, or the like according to time.

In the present specification, a magnitude of a gradient magnetic field may mean a slope of a gradient. Furthermore, a sign of a gradient magnetic field may be the same as a sign of the slope of the gradient. For example, if a gradient magnetic field has a negative sign, the slope of the gradient may be negative. In addition, an area of a gradient magnetic field may be defined as a magnitude of the gradient magnetic field multiplied by the time during which the gradient magnetic field is applied.

FIG. 1A is a pulse sequence schematic diagram of a spin echo according to an exemplary embodiment.

Referring to FIG. 1A, in the spin echo sequence, after a 90° excitation RF pulse 101, at least one 180° refocusing RF pulse 102 through 104 may be applied to an object. During application of the 90° excitation RF pulse 101 and the at least one 180° refocusing RF pulse 102 through 104, slice-selection gradient magnetic fields 111 through 114, corresponding to the 90° excitation RF pulse 101 and the at least one 180° refocusing RF pulse 102 through 104, for selecting slices to be imaged are applied to the object. Although not shown in FIG. 1A, frequency encoding gradient magnetic fields may respectively be applied after the 180° refocusing RF pulses 102 through 104.

As the 90° excitation RF pulse 101 causes spins in a selected slice to be in-phase, transverse magnetization may be formed in the x-y plane.

When application of the 90° excitation RF pulse 101 is stopped, the spins that are in-phase dephase due to extrinsic magnetic field inhomogeneity and spin-spin interactions in tissue, and thus, a free induction decay (FID) signal may be generated. The FID signal decays at a decay rate T2*. When one 180° refocusing RF pulse (e. g., 102) is applied after a time period $TE_1/2$ elapsed from application of the 90° excitation RF pulse 101, the dephased spins may be back in-phase after a time period $TE_1/2$ elapsed from the time of the start of the application of the 180° refocusing RF pulse 102, and a spin echo signal 131 corresponding to the FID signal may be generated. In this case, since dephasing of spins due to the extrinsic magnetic field inhomogeneity may be removed by applying the 180° refocusing RF pulse 102, the spin echo signal 131 may be acquired according to T2 relaxation (decay).

In order to acquire the spin echo signal 131, a frequency encoding gradient magnetic field 122 may be applied to the object during generation of the spin echo signal 131. To minimize dephasing of spins due to the frequency encoding gradient magnetic field 122 at a time point TE when the spin echo signal reaches its maximum, an additional gradient magnetic field 121 having the same sign as the frequency encoding gradient magnetic field 122 may be applied to the object prior to the 180° refocusing RF pulse 102.

FIG. 1B is a pulse sequence schematic diagram of a GRASE sequence according to an exemplary embodiment.

Referring to FIG. 1B, the GRASE sequence is a sequence for acquiring many echoes within one TR by obtaining, together with spin echo signals 131 and 132, gradient echo signals 141 through 144 before or after the spin echo signals 131 and 132.

In the GRASE sequence, the gradient echo signals 141 through 144 may be acquired by applying bi-lobed gradient magnetic fields to an object instead of a 180° refocusing RF pulse. The bi-lobed gradient magnetic fields are applied to the object to accelerate dephasing of spins, and then rephase the dephased spins at a particular time point. A method of generating an echo signal by using a gradient magnetic field instead of a 180° refocusing RF pulse may be referred to as a gradient recalled echo (GRE) technique.

For example, after dephasing of spins is accelerated by applying a frequency encoding gradient magnetic field 121 having an area of ½ prior to a 180° refocusing RF pulse 102, the dephased spins may be rephased by applying a frequency encoding gradient magnetic field 151 having an area of 1 after the 180° refocusing RF pulse 102. As a result of the rephasing, the gradient echo signal 141 corresponding to a FID signal produced by the 90° excitation RF pulse 101 may be generated at the center of the frequency encoding gradient magnetic field 151.

Then, to return to a state in which only the frequency encoding gradient magnetic field 121 having an area of ½ was applied, a frequency encoding gradient magnetic field 153 having the same magnitude as, but an opposite sign to, the frequency encoding gradient magnetic field 151 may be applied.

Thereafter, to acquire the spin echo signal 131, a frequency encoding gradient magnetic field 122 may be applied before a time period $TE_1/2$ elapses and after the time period $TE_1/2$ elapsed from the time of a start of an application of the 180° refocusing RF pulse 102. Furthermore, to eliminate dephasing of spins due to the applied frequency encoding gradient magnetic field 122, a frequency encoding gradient magnetic field 155 having the same magnitude as, but an opposite sign to, the frequency encoding gradient magnetic field 122 may be applied.

Then, to generate the gradient echo signal 142, a frequency encoding gradient magnetic field 156 having an area of 1 may be applied. Due to the frequency encoding gradient magnetic field 121 having an area of ½ applied prior to the 180° refocusing RF pulse 102 and the frequency encoding gradient magnetic field 156 having an area of 1, the gradient echo signal 142 may be generated at the center of the frequency encoding gradient magnetic field 156.

Because a GRE technique uses a gradient magnetic field instead of a 180° refocusing RF pulse to generate a gradient echo signal, dephasing of spins may occur to a greater extent than in the case wherein a spin echo sequence is used. In other words, the gradient echo signal may be acquired according to T2* relaxation instead of T2 relaxation. Thus, a gradient echo sequence is more sensitive to magnetic susceptibility of tissue. Sensitivity of magnetic susceptibility may cause adverse effects such as an increase in artifacts at an interface between air and tissue. For example, artifacts may occur in captured images of air/tissue interfaces such as an abdomen or sinuses.

Furthermore, since dephasing of spins in a voxel proceeds rapidly, a gradient echo signal may become sensitive to main magnet field inhomogeneity, and chemical shift artifacts may occur in an image generated based on the gradient echo signal.

Thus, while a GRASE sequence can acquire more echoes within the same amount of time compared to a spin echo sequence, the GRASE sequence may suffer from the above-described problems since it includes a gradient echo acquired using a GRE technique.

Furthermore, if one k-space is determined based on consecutively acquired spin echoes and gradient echoes, and an image is generated based on the determined k-space, the generated image may exhibit various kinds of problems compared to an image generated from the same types of echoes. Furthermore, if two images are respectively generated based on a spin echo and a gradient echo from among consecutively acquired spin echoes and gradient echoes, a large difference may exist between data in the two images of the same slice.

Thus, there is a need for using a sequence that generates many echoes within one TR, all of which are spin echoes.

Figure 2:
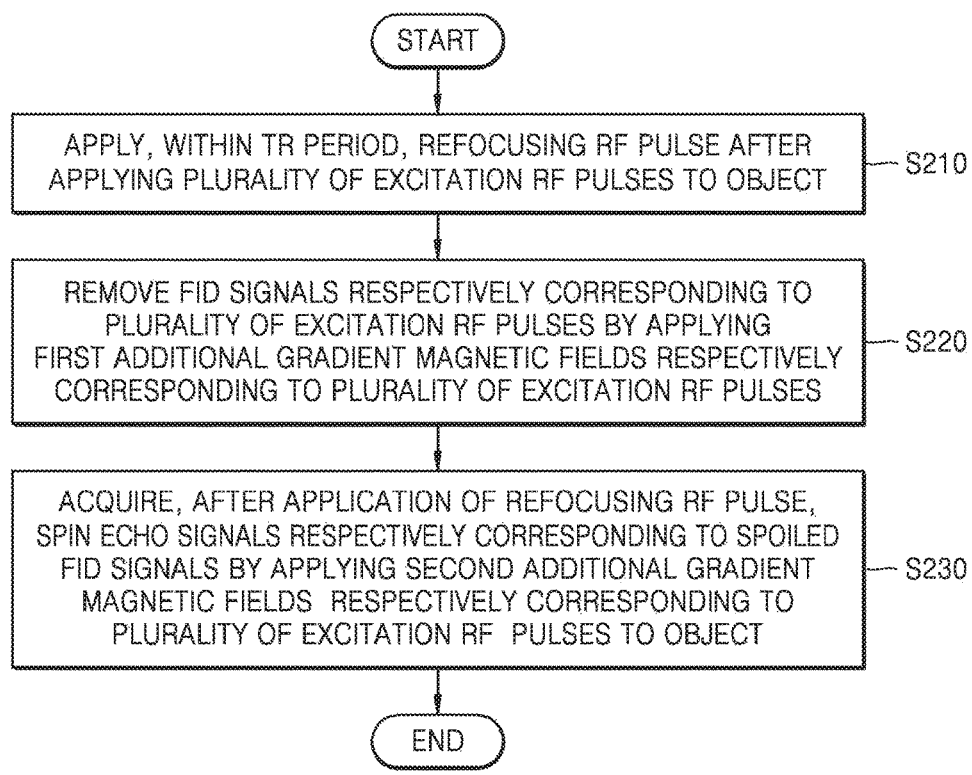
FIG. 2 is a flowchart of a method, performed by a magnetic resonance imaging (MRI) apparatus, of generating a series of spin echoes by using a series of excitation radio frequency (RF) pulses and additional gradient magnetic fields, according to an exemplary embodiment.

FIG. 2 is a flowchart of a method of generating a series of spin echoes by using a series of excitation RF pulses and additional gradient magnetic fields, the method being performed by a magnetic resonance imaging (MRI) apparatus (100 of FIG. 10), according to an exemplary embodiment.

The MRI apparatus 100 may apply, within a TR period, a refocusing RF pulse to an object after applying a plurality of excitation RF pulses thereto (S210).

The plurality of excitation RF pulses may have different flip angles. Furthermore, the plurality of excitation RF pulses may excite the same slice of an object. The plurality of excitation RF pulses may be two consecutive excitation RF pulses.

The MRI apparatus 100 may spoil FID signals respectively produced by the plurality of excitation RF pulses by applying first additional gradient magnetic fields respectively corresponding to the plurality of excitation RF pulses to the object (S220).

For example, if the plurality of excitation RF pulses include a and b excitation RF pulses, the first additional gradient magnetic fields may include a_first and b_first additional gradient magnetic fields respectively corresponding to the a and b excitation RF pulses. In this case, the a_first and b_first additional gradient magnetic fields may have different areas or the same area.

An area of each of the first additional gradient magnetic fields may be determined based on at least one of a thickness of a slice of an object excited by the plurality of excitation RF pulses and a magnitude of a FID signal.

Furthermore, a first additional gradient magnetic field may be added to at least one of a slice-selection gradient magnetic field, a phase encoding gradient magnetic field, and a frequency encoding gradient magnetic field.

After the refocusing RF pulse is applied, the MRI apparatus 100 may acquire spin echo signals respectively corresponding to the spoiled FID signals by applying second additional gradient magnetic fields respectively corresponding to the plurality of excitation RF pulses to the object (S230).

A second additional gradient magnetic field may be added to at least one of a slice-selection gradient magnetic field, a phase encoding gradient magnetic field, and a frequency encoding gradient magnetic field.

After a spin echo signal is acquired, the MRI apparatus 100 may spoil again the spin echo signal by applying a gradient magnetic field having the same area as, but an opposite sign to, a second additional gradient magnetic field.

The MRI apparatus 100 may acquire one k-space based on spin echo signals respectively corresponding to FID signals produced by a plurality of excitation RF pulses and may obtain an MR image of an object based on the acquired k-space.

Alternatively, the MRI apparatus 100 may acquire a plurality of k-spaces based on spin echo signals respectively corresponding to FID signals produced by a plurality of excitation RF pulses and may obtain MR images of an object respectively corresponding to the acquired k-spaces. Furthermore, the MRI apparatus 100 may obtain a single MR image by combining together the obtained MR images of the object.

Figure 3:
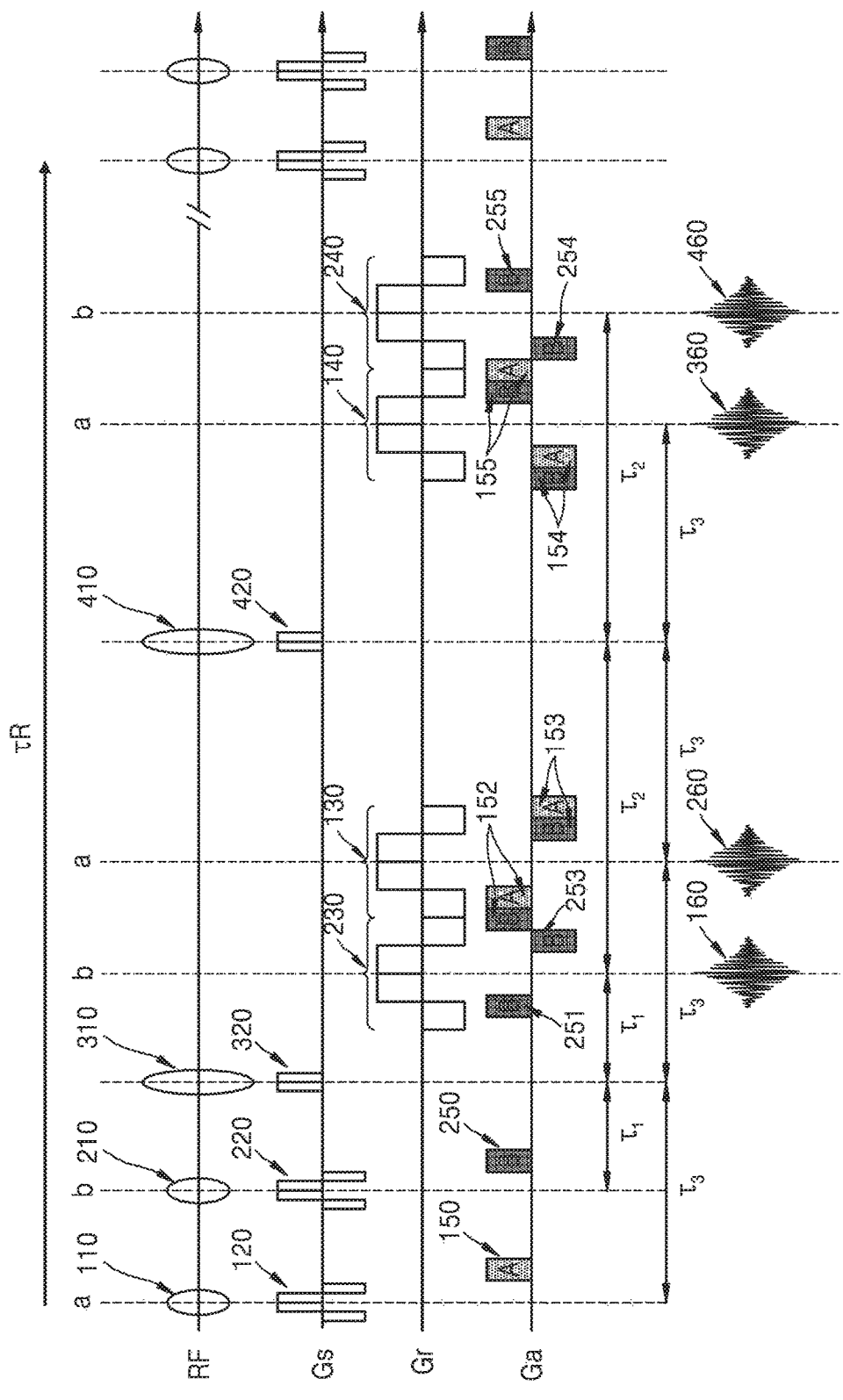
FIG. 3 is a pulse sequence schematic diagram of a pulse sequence for acquiring an MR signal by using two (2) consecutive excitation RF pulses and additional gradient magnetic fields, according to an exemplary embodiment.

FIG. 3 is a pulse sequence schematic diagram for a pulse sequence for acquiring an MR signal by using two (2) consecutive excitation RF pulses and additional gradient magnetic fields, according to an exemplary embodiment Referring to FIG. 3, before application of a first refocusing RF pulse 310 to an object, the MRI apparatus 100 may consecutively apply a and b excitation RF pulses 110 and 210 to the object.

The a and b excitation RF pulses 110 and 210 may be 90° RF pulses or RF pulses with a flip angle less than or greater than 90°. Furthermore, the a and b excitation RF pulses 110 and 210 may have different flip angles. According to an exemplary embodiment, to apply the a and b excitation RF pulses 110 and 210 having different flip angles from each other, strengths or application times of the a and b excitation RF pulses 110 and 210 may be set differently.

During application of the two excitation RF pulses, i.e., the a and b excitation RF pulses 110 and 210, the MRI apparatus 100 may apply first and second slice-selection gradient magnetic fields 120 and 220 to select a slice of the object. As the a and b excitation RF pulses 110 and 210 are applied to the object, spins in the selected slice of the object may create transverse magnetization in an x-y plane direction.

The a and b excitation RF pulses 110 and 210 may excite spins in the same slice. For example, if the a and b excitation RF pulses 110 and 210 have the same frequency or the first and second slice-selection gradient magnetic fields 120 and 220 are set to the same value, the a and b excitation RF pulses 110 and 210 may excite spins in the same slice.

Furthermore, according to an exemplary embodiment, the a and b excitation RF pulses 110 and 210 may excite spins in different slices. For example, the a and b excitation RF pulses 110 and 210 may have different frequencies, and the first or second slice-selection gradient magnetic fields 120 and 220 may be set to different values.

After the a excitation RF pulse 110 that has been previously applied to the object is stopped, a FID signal may be generated from the object as spins forming transverse magnetization begin to dephase. The MRI apparatus 100 may spoil the FID signal resulting from the a excitation RF pulse 110 in order to prevent the FID signal resulting from the a excitation RF pulse 110 from mixing with a FID signal resulting from the b excitation RF pulse 210 to be consecutively applied. According to an exemplary embodiment, the MRI apparatus 100 may apply a_first additional gradient magnetic field 150 to the object.

Spoiling of the FID signal may mean accelerating dephasing of spins, which form the transverse magnetization in the x-y plane due to an excitation RF pulse, by applying an additional gradient magnetic field to the object.

After a_first additional gradient magnetic field 150 that have been previously applied to the object is stopped, the MRI apparatus 100 may apply the b excitation RF pulse 210 to the object. After the b excitation RF pulse 210 is stopped, the MRI apparatus 100 may spoil a FID signal resulting from the b excitation RF pulse 210 as well by applying b_first additional gradient magnetic field 250 to the object. In this case, dephasing of spins that form transverse magnetization due to the b excitation RF pulse 210 may also be accelerated by the b_first additional gradient magnetic field 250.

The b_first additional gradient magnetic field 250 may have the same area as, or different areas from, the a_first additional gradient magnetic field 150. An area of the a_first additional gradient magnetic field 150 or the b_first additional gradient magnetic field 250 may be determined based on at least one of a thickness of a slice of the object excited by the a or b excitation RF pulse 110 or 210 and a magnitude of a FID signal produced by the a or b excitation RF pulse 110 or 210. For example, if a thickness of an excited slice is 5 mm and a phase dispersion of $4\pi$ is required to spoil a FID signal, an area of an additional gradient magnetic field may be calculated as 9.396 mT*ms/m (phase/(gamma* delta_z)=$4\pi/(2\pi \times 42.57$ kHz/mT$\times 0.005$ m). An area of an additional area may be calculated using a method described in Chapter 10. 5 of the "Handbook of MRI Pulse Sequences."

Furthermore, additional gradient magnetic fields 150, 152, 153, 154, 155, 250, 251, 253, 254, and 255 may each be applied as one of a slice-selection gradient magnetic field Gs, a phase encoding gradient magnetic field, and a frequency encoding gradient magnetic field Gr or may be dispersed via two or three gradient magnetic fields. When each of the additional gradient magnetic fields 150, 152, 153, 154, 155, 250, 251, 253, 254, and 255 is applied as one gradient magnetic field, the MRI apparatus 100 may maximize dephasing of spins by adding the additional gradient magnetic fields 150, 152, 153, 154, 155, 250, 251, 253, 254, and 255 to a slice-selection gradient magnetic field for selecting a thickest slice.

After the b_first additional gradient magnetic field 250 that has been previously applied to the object is stopped, the MRI apparatus 100 may apply a first refocusing RF pulse 310 to the object. During application of the first refocusing RF pulse 310, the MRI apparatus 100 may apply a third slice-selection gradient magnetic field 320 to the object.

The first refocusing RF pulse 310 may rephase spins dephased after the a excitation RF pulse 110 was applied simultaneously with spins dephased after the b excitation RF pulse 210 was applied. For example, the first refocusing RF pulse 310 may form a spin echo sequence with the b excitation RF pulse 210 while simultaneously forming a spin echo sequence with the a excitation RF pulse 110.

After application of the first refocusing RF pulse 310, the MRI apparatus 100 may apply b_second additional gradient magnetic field 251 to the object in order to acquire a first spin echo signal 160 generated in response to the b excitation RF pulse 210. The b_second additional gradient magnetic field 251 may have the same area as, but an opposite sign to, the b_first additional gradient magnetic field 250.

Spins which form transverse magnetization due to the b excitation RF pulse 210 may be dephased by the b_first additional gradient magnetic field 250, and the first refocusing RF pulse 310 may change a phase of the dephased spins by 180 degrees (i.e., changing the sign of the phase). The resulting spins may be rephased again by applying the b_second additional gradient magnetic field 251.

Furthermore, according to an exemplary embodiment, the b_first additional gradient magnetic field 250 and the b_second additional gradient magnetic field 251 may be referred to as crusher gradient magnetic fields.

After the spins are rephased by the b_second additional gradient magnetic field 251, the first spin echo signal 160 may be generated in correspondence to a spoiled FID signal produced by the b excitation RF pulse 210.

To acquire the first spin echo signal 160, the MRI apparatus 100 may apply a first frequency encoding gradient magnetic field 230 to the object. In this case, when a time interval between application of the b excitation RF pulse 210 and the first refocusing RF pulse 310 is $\tau_1$, the first spin echo signal 160 reaches a maximum at a time point that is the time interval $\tau_1$ after application of the first refocusing RF pulse 310, and a magnitude and a sign of the first frequency encoding gradient magnetic field 230 may be determined so that spins are in-phase at the time point.

Following the acquisition of the first spin echo signal 160, b_third additional gradient magnetic field 253 having the same area as, but an opposite sign to, the b_second additional gradient magnetic field 251 may be applied to the object in order to spoil again the first spin echo signal 160.

After an application of the b_third additional gradient magnetic field 253 is stopped, the MRI apparatus 100 may apply a_second additional gradient magnetic field 152 to the object in order to acquire an echo signal resulting from the a excitation RF pulse 110. In this case, an area of the a_second additional gradient magnetic field 152 may be the sum of areas of the a_first additional gradient magnetic field 150 and the b_first additional gradient magnetic field 250. Spins which form transverse magnetization due to the a excitation RF pulse 110 may be dephased by the a_first additional gradient magnetic field 150 and the b_first additional gradient magnetic field 250, and the first refocusing RF pulse 310 may change a phase of the dephased spins by 180 degrees (i.e., changing the sign of the phase). The resulting spins may be rephased again by applying the a_second additional gradient magnetic field 152 having an area equal to the sum of areas of the a_first additional gradient magnetic field 150 and the b_first additional gradient magnetic field 250.

After the spins are rephased by the a_second additional gradient magnetic field 152, a second spin echo signal 260 may be generated which corresponds to a spoiled FID signal produced by the a excitation RF pulse 110.

To acquire the second spin echo signal 260, the MRI apparatus 100 may apply a second frequency encoding gradient magnetic field 130 to the object. In this case, when a time interval between application of the a excitation RF pulse 110 and the first refocusing RF pulse 310 is $\tau_3$, the second spin echo signal 120 reaches its maximum at a time point that is the time interval $\tau_3$ after the first refocusing RF pulse 310, and a magnitude and a sign of the second frequency encoding gradient magnetic field 130 may be determined so that spins are in-phase at the time point.

Following the acquisition of the second spin echo signal 260, the MRI apparatus 100 may apply a_third additional gradient magnetic field 153 having the same area as, but an opposite sign to, the a_second additional gradient magnetic field 152 to the object in order to spoil again the second spin echo signal 260.

After acquiring and spoiling the first and second spin echo signals 160 and 260, the MRI apparatus 100 may apply a second refocusing RF pulse 410 and a fourth slice-selection gradient magnetic field 420 to the object.

The second refocusing RF pulse 410 may rephase spins dephased after the first refocusing RF pulse 310. For example, the second refocusing RF pulse 410 may form a spin echo sequence with the b excitation RF pulse 210 while simultaneously forming a spin echo sequence with the a excitation RF pulse 110 and the first refocusing RF pulse 310.

After the second refocusing RF pulse 410 applied to the object is stopped, the MRI apparatus 100 may apply a_fourth additional gradient magnetic field 154 and b_fourth additional gradient magnetic field 254 to the object in order to generate again a spoiled echo signal. For example, the MRI apparatus 100 may apply the a_fourth additional gradient magnetic field 154 to the object in order to generate a third spin echo signal 360 corresponding to the second spin echo signal 260 spoiled by the a_third additional gradient magnetic field 153. The a_fourth additional gradient magnetic field 154 may have the same magnitude as the a_third additional gradient magnetic field 153 but an opposite sign thereto due to the second refocusing RF pulse 410.

As the third spin echo signal 360 is generated again, the MRI apparatus 100 may apply a third frequency encoding gradient magnetic field 140 to the object in order to acquire the spin echo signal 360.

Following the acquisition of the third spin echo signal 360, the MRI apparatus 100 may apply a_fifth additional gradient magnetic field 155 to the object in order to spoil again the third spin echo signal 360.

Furthermore, the MRI apparatus 100 may apply the b_fourth additional gradient magnetic field 254 to the object in order to generate a fourth spin echo signal 460 corresponding to the first spin echo signal 160 spoiled by the b_third additional gradient magnetic field 253. As the fourth spin echo signal 460 is generated, the MRI apparatus 100 may apply a fourth frequency encoding gradient magnetic field 240 the object in order to acquire the fourth spin echo signal 460.

Following the acquisition of the fourth spin echo signal 460, b_fifth additional gradient magnetic field 255 may be applied to the object in order to spoil again the fourth spin echo signal 460.

A plurality of refocusing RF pulses may be applied within one TR, and spin echo signals corresponding to the a and b excitation RF pulses 110 and 210 may be generated repeatedly.

After a lapse of one TR period, spin echo signals may be repeatedly generated by applying excitation RF pulses respectively having the same angles as the a and b excitation RF pulses 110 and 210.

As described with reference to FIG. 3, an echo signal produced by an excitation RF pulse may be shifted to a specific position by using an additional gradient magnetic field. Such an echo shifting method may be based on the Principles of Echo Shifting with a Train of Observations (PRESTO) (A Functional MRI Technique Combining Principles of Echo Shifting with a Train of Observations (PRESTO), Liu, Soebering, Duyn, et al. 1993 and Chapter 16.3, Handbook of MRI Pulse Sequences).

Figure 4:
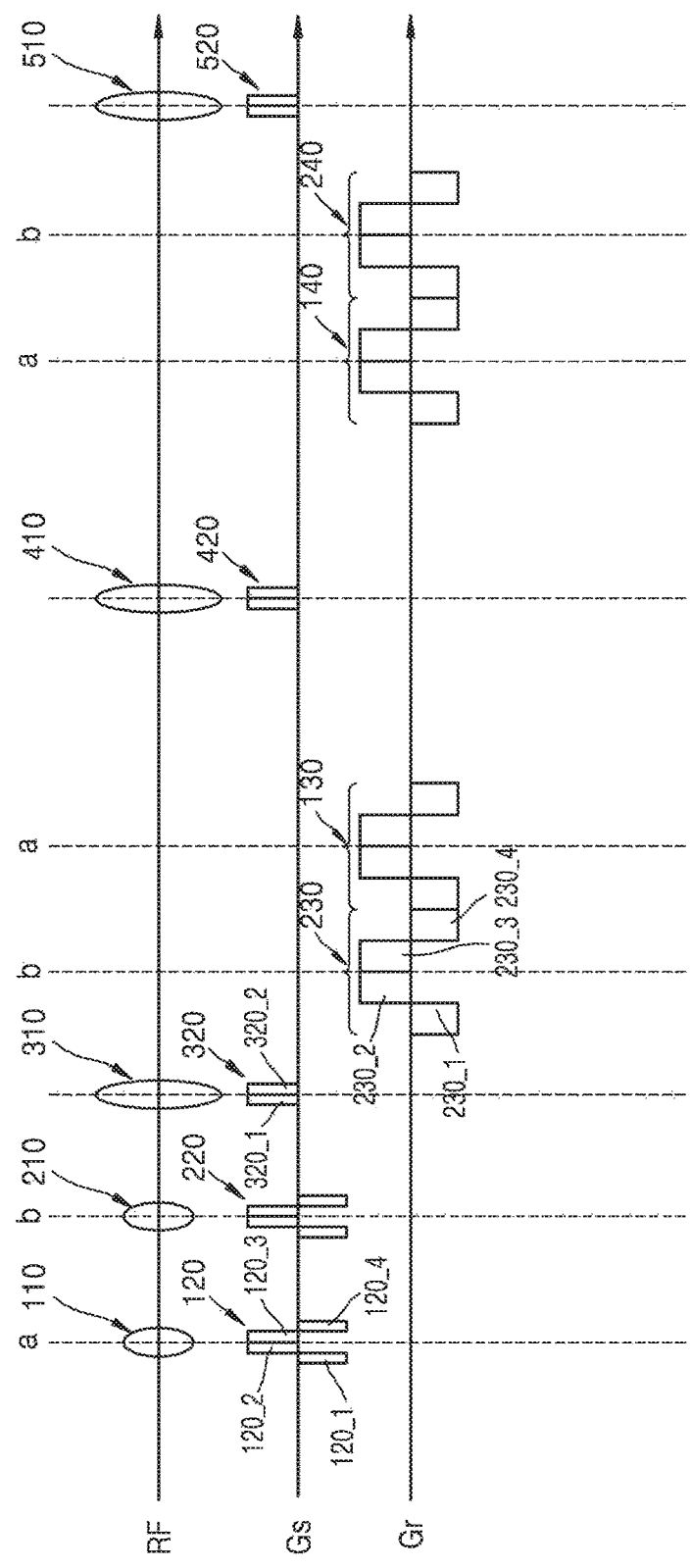
FIG. 4 illustrates an example wherein an MRI apparatus applies a slice-selection gradient magnetic field, a phase encoding gradient magnetic field, and a frequency encoding gradient magnetic field to an object, according to an exemplary embodiment.

FIG. 4 illustrates an example wherein the MRI apparatus 100 applies a slice-selection gradient magnetic field, a phase encoding gradient magnetic field, and a frequency encoding gradient magnetic field to an object, according to an exemplary embodiment.

Referring to FIG. 4, in order to prevent dephasing of spins due to a gradient magnetic field other than an additional gradient magnetic field, the MRI apparatus 100 may apply each gradient magnetic field to the object so that a phase change of spins introduced by a gradient magnetic field other than an additional gradient magnetic field is zero (0).

For example, a first slice-selection gradient magnetic field 120 may consist of positive gradient magnetic fields 120_2 and 120_3 for selecting a slice of an object and negative gradient magnetic fields 120_1 and 120_4 having the same area and an opposite sign to the positive gradient magnetic fields 120_2 and 120_3.

Furthermore, a first frequency encoding gradient magnetic field 230 may consist of positive gradient magnetic fields 230_2 and 230_3 and negative gradient magnetic fields 230_1 and 230_4 having the same area and an opposite sign to the positive gradient magnetic fields 230_2 and 230_3.

Furthermore, a third slice-selection gradient magnetic field 320 may include first and second gradient magnetic fields 320_1 and 320_2 having the same area and the same sign as each other. The first gradient magnetic field 320_1 may diphase spins, and the second gradient magnetic field 320_2 may rephase the spins as a sign of phase of the spins are changed due to a 180° refocusing RF pulse 310.

Figure 5A:
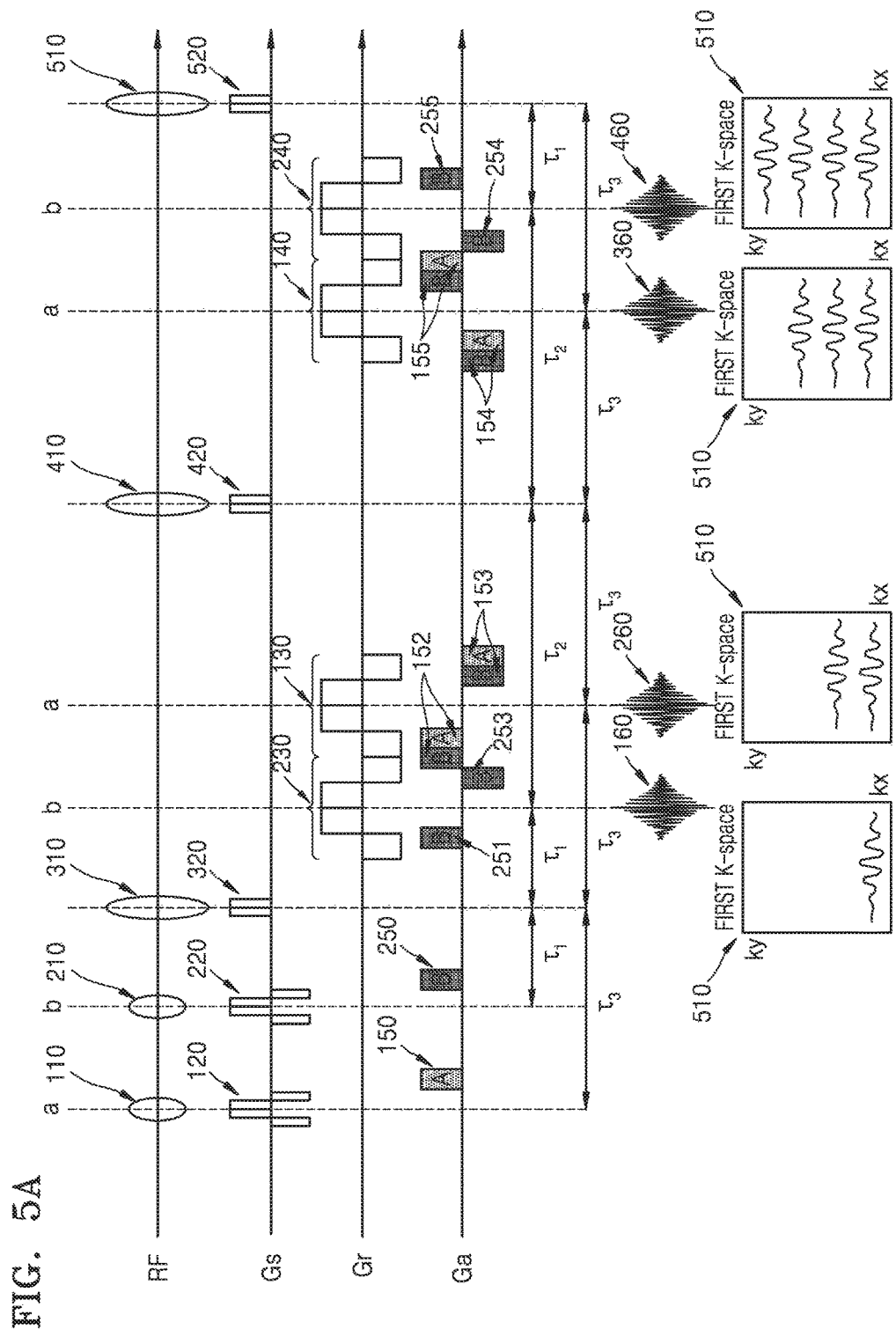
FIGS. 5A and 5B illustrate examples wherein an MRI apparatus determines a K-space based on a spin echo signal, according to an exemplary embodiment.
Figure 5B:
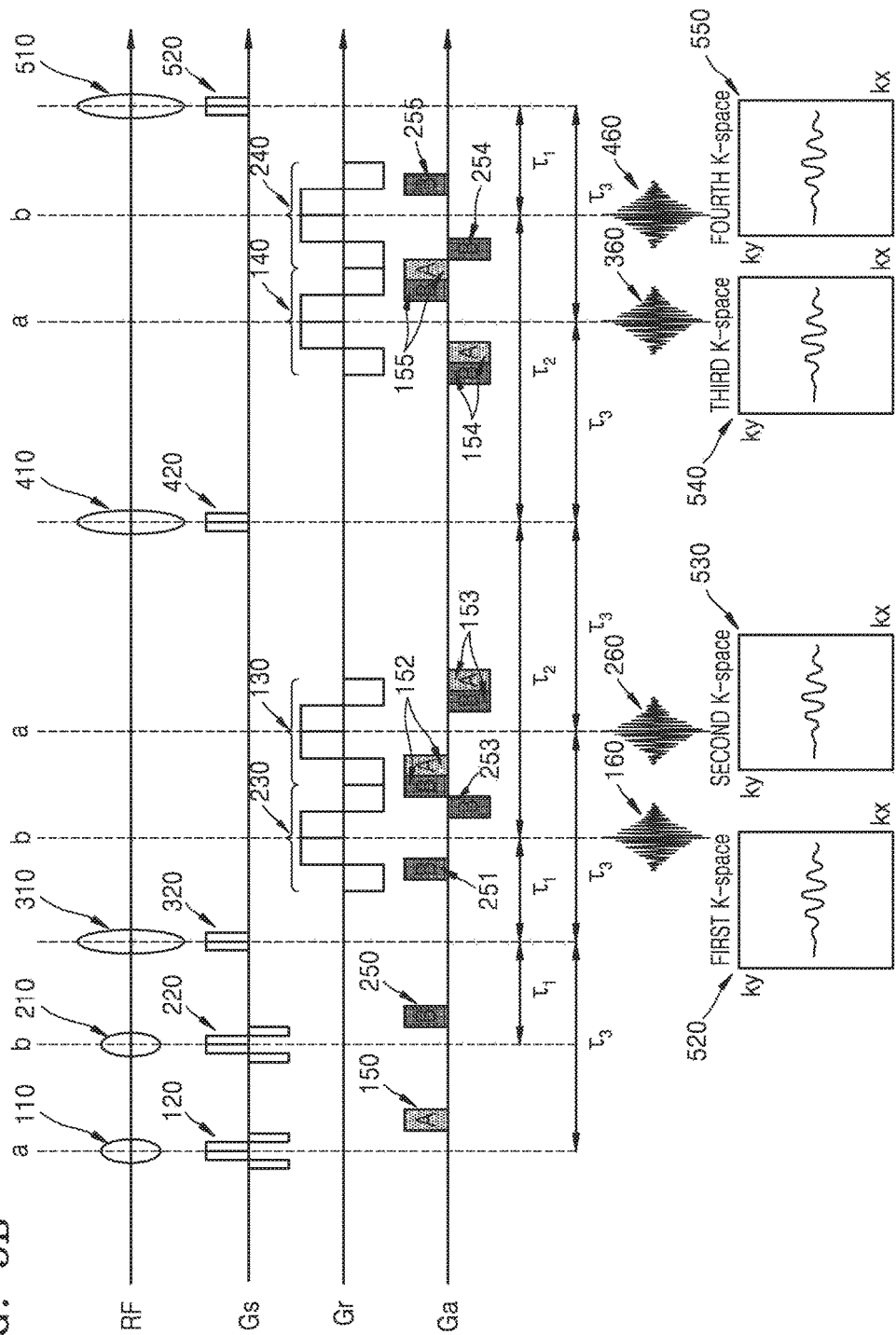

FIGS. 5A and 5B illustrate examples where the MRI apparatus 100 determines a K-space based on a spin echo signal, according to an exemplary embodiment;

Referring to FIG. 5A, the MRI apparatus 100 may acquire one K-space 510 based on spin echo signals respectively corresponding to FID signals produced by a plurality of excitation RF pulse.

The MRI apparatus 100 may acquire different Ky values for the K-space 510 respectively from spin echo signals by sequentially increasing or decreasing a phase encoding gradient magnetic field. For example, the MRI apparatus 100 may acquire different Ky values for the K-space 510 based on first through fourth spin echo signals 160, 260, 360, and 460 and obtain an MR image of an excited slice based on the resulting K-space 510.

Referring to FIG. 5B, the MRI apparatus 100 may acquire a plurality of K-spaces, first through fourth K-spaces 520, 530, 540, and 550 based on first through fourth spin echo signals 160, 260, 360, and 460 respectively corresponding to FID signals respectively produced by a plurality of excitation RF pulses.

For example, the MRI apparatus 100 may fix a phase encoding gradient magnetic field while acquiring a predetermined number of spin echo signals and acquire one Ky value for different K-spaces respectively based on the spin echo signals. In detail, the MRI apparatus 100 may acquire a Ky value for the first K-space 520 based on the first spin echo signal 160, and the Ky value for the second K-space 530 based on the second spin echo signal 260.

The MRI apparatus 100 may obtain MR images based on acquired first through fourth K-spaces 520 through 550. Furthermore, the MRI apparatus 100 may combine the obtained MR images into a single MR image. For example, the MRI apparatus 100 may generate a single MR image by interpolating data from the obtained MR images.

Figure 6A:
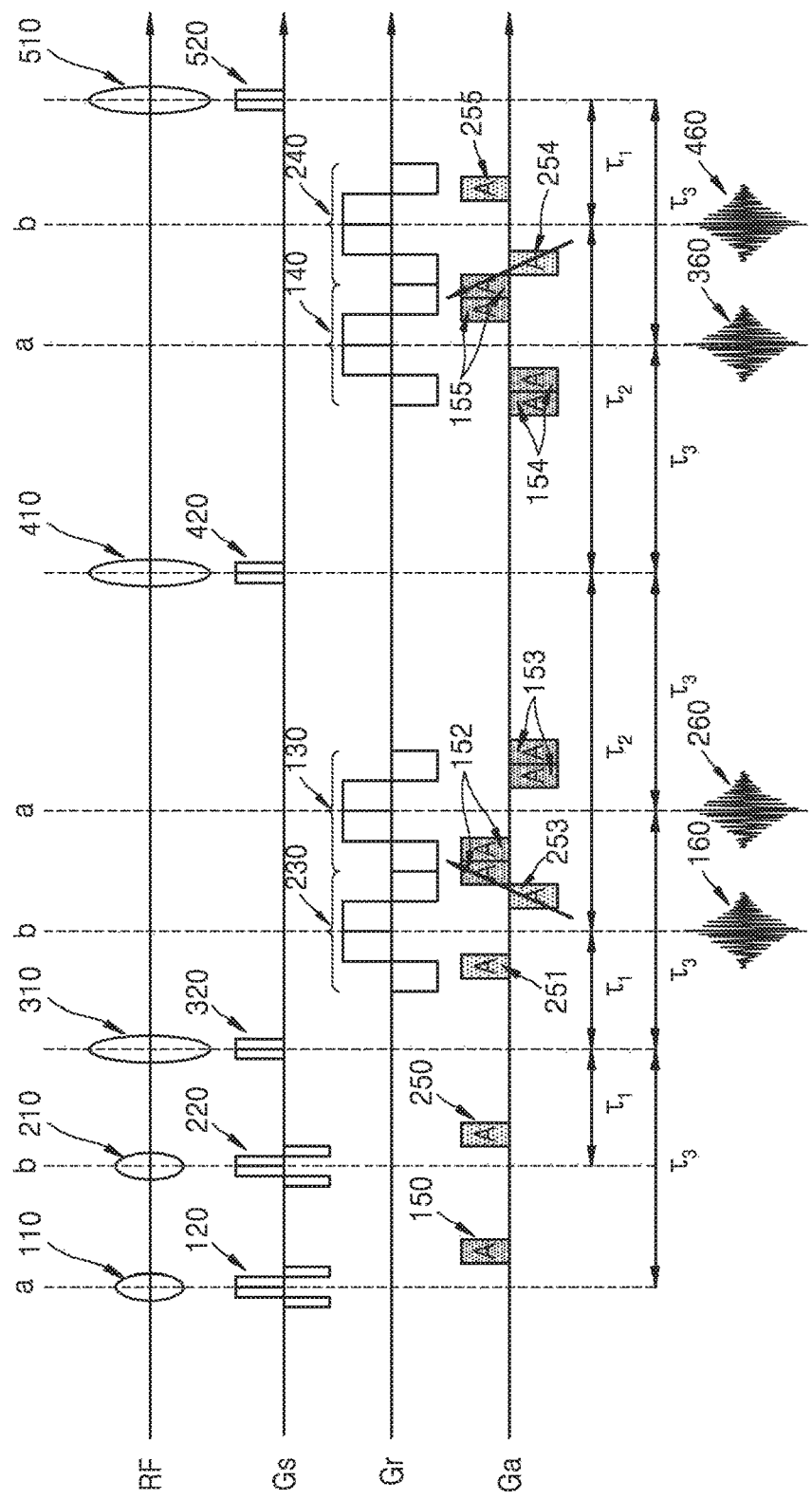
FIGS. 6A and 6B illustrate sequences modified by reducing the number of additional gradient magnetic fields applied to an object, according to an exemplary embodiment.
Figure 6B:
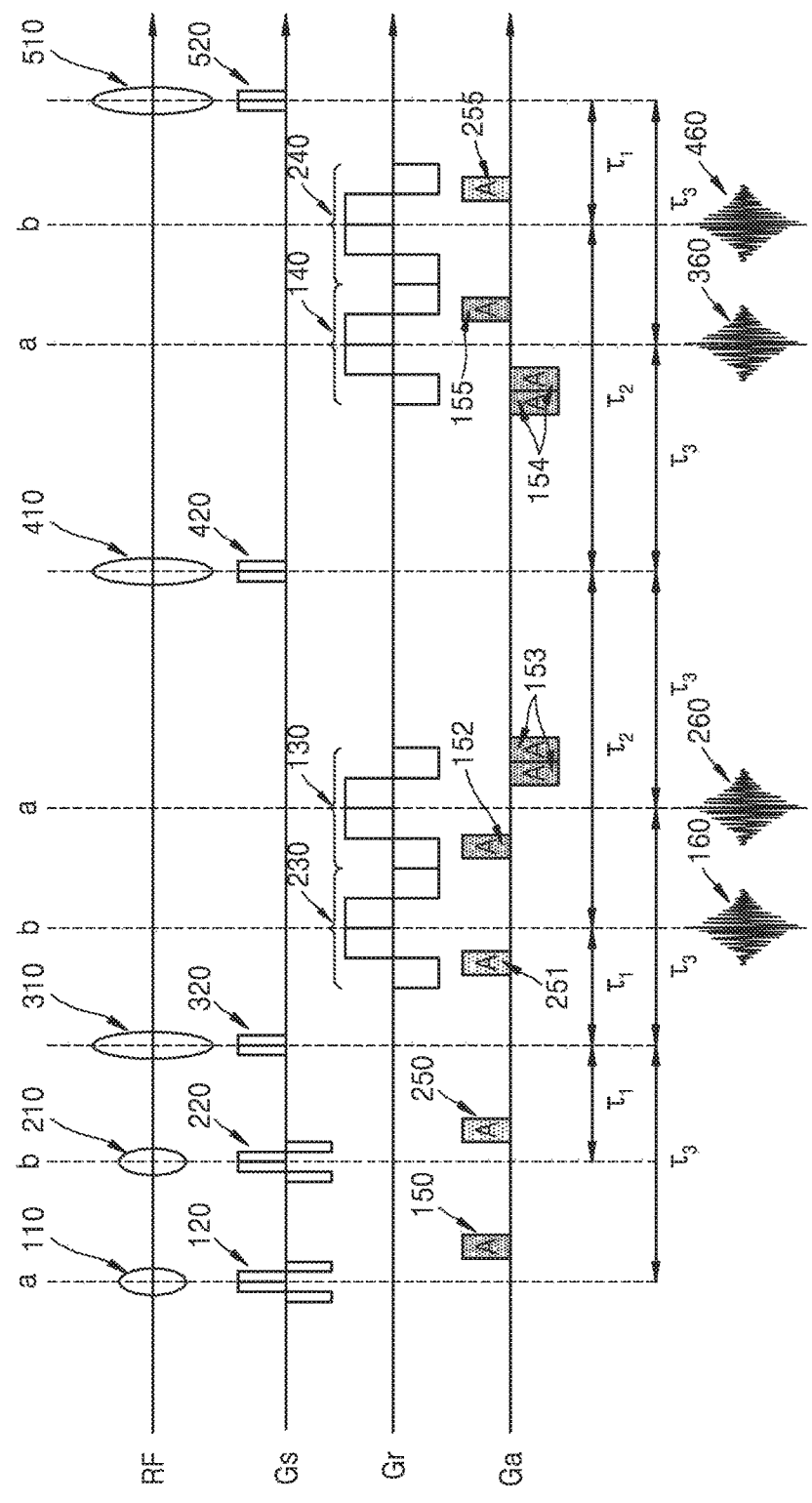

FIGS. 6A and 6B illustrate sequences modified by reducing the number of additional gradient magnetic fields that are applied to an object, according to an exemplary embodiment.

Referring to FIG. 6A, a_first additional gradient magnetic field 150 may have the same area as b_first additional gradient magnetic field 250.

When an area for the a_first additional gradient magnetic field 150 and the b_first additional gradient magnetic field 250 is a unit area A, an area for b_second additional gradient magnetic field 251 and b_third additional gradient magnetic field 253 may also be the unit area A. Thus, areas of additional gradient magnetic fields may respectively be the unit area A or multiples of the unit area A.

Furthermore, gradient magnetic fields having opposite signs during the same interval may cancel each other out.

For example, because a_second additional gradient magnetic field 152 and the b_third additional gradient magnetic field 253 to be applied to the object between acquisition of first and second spin echo signals 160 and 260 have opposite signs and the a_second additional gradient magnetic field 152 has twice the magnitude of the b_third additional gradient magnetic field 253, positive area A and negative area A may cancel each other out. Thus, after the first spin echo signal is applied, the MRI apparatus 100 may apply only an additional gradient magnetic field having a positive area A to the object before the acquisition of the second spin echo signal 260.

FIG. 6B illustrates a sequence obtained after pairs of additional cancellable gradient magnetic fields, i.e., gradient magnetic fields 152 and 253 and gradient magnetic fields 155 and 254 of FIG. 6A, cancelled each other out.

Thus, as unnecessary gradient magnetic fields are not applied to the object, it is possible to reduce load on the MRI apparatus 100 due to application of gradient magnetic fields and inconvenience for a patient placed within an MRI bore.

Figure 7A:
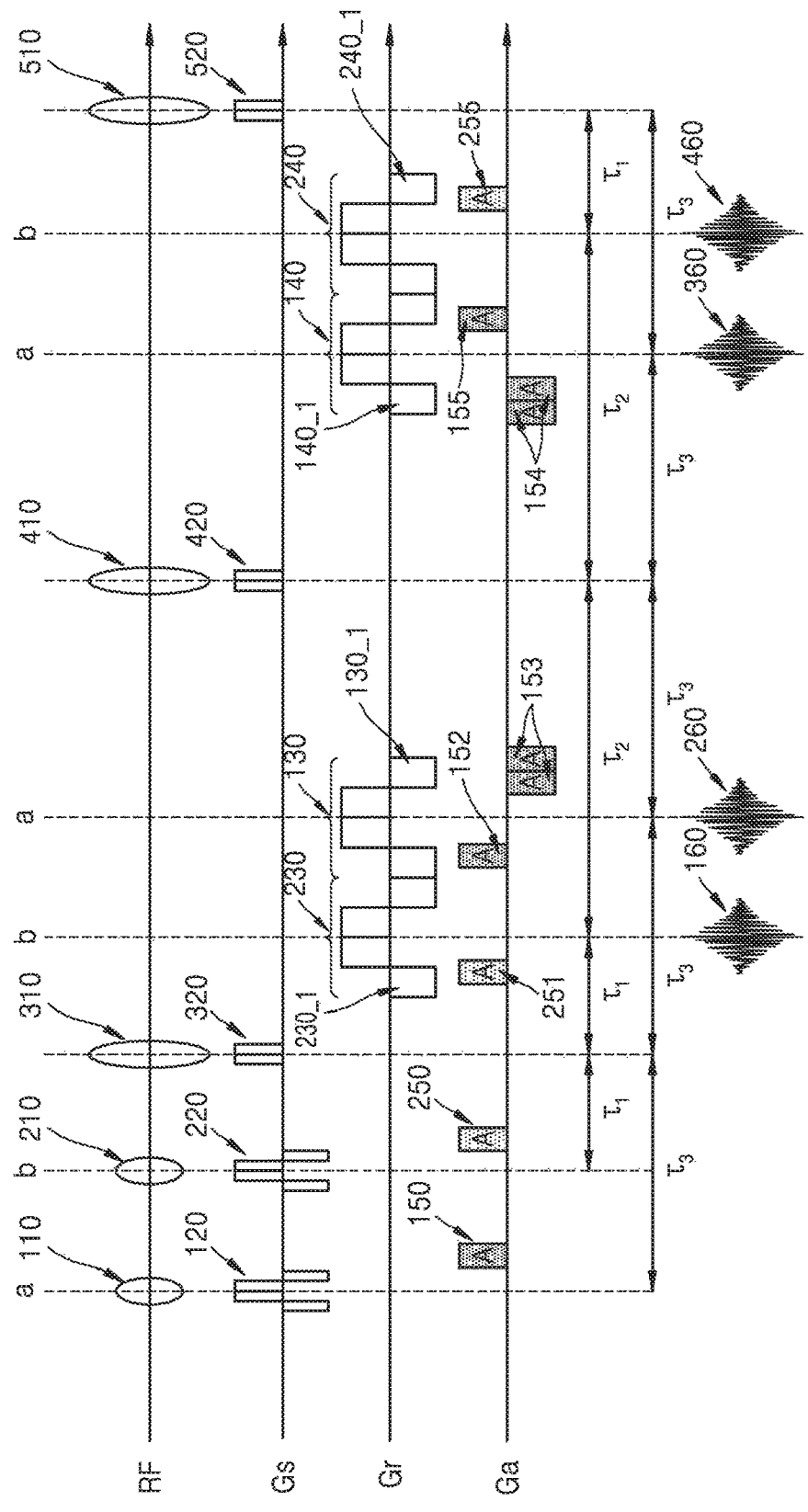
FIGS. 7A and 7B illustrate sequences modified by adjusting a frequency encoding gradient magnetic field, according to an exemplary embodiment.
Figure 7B:
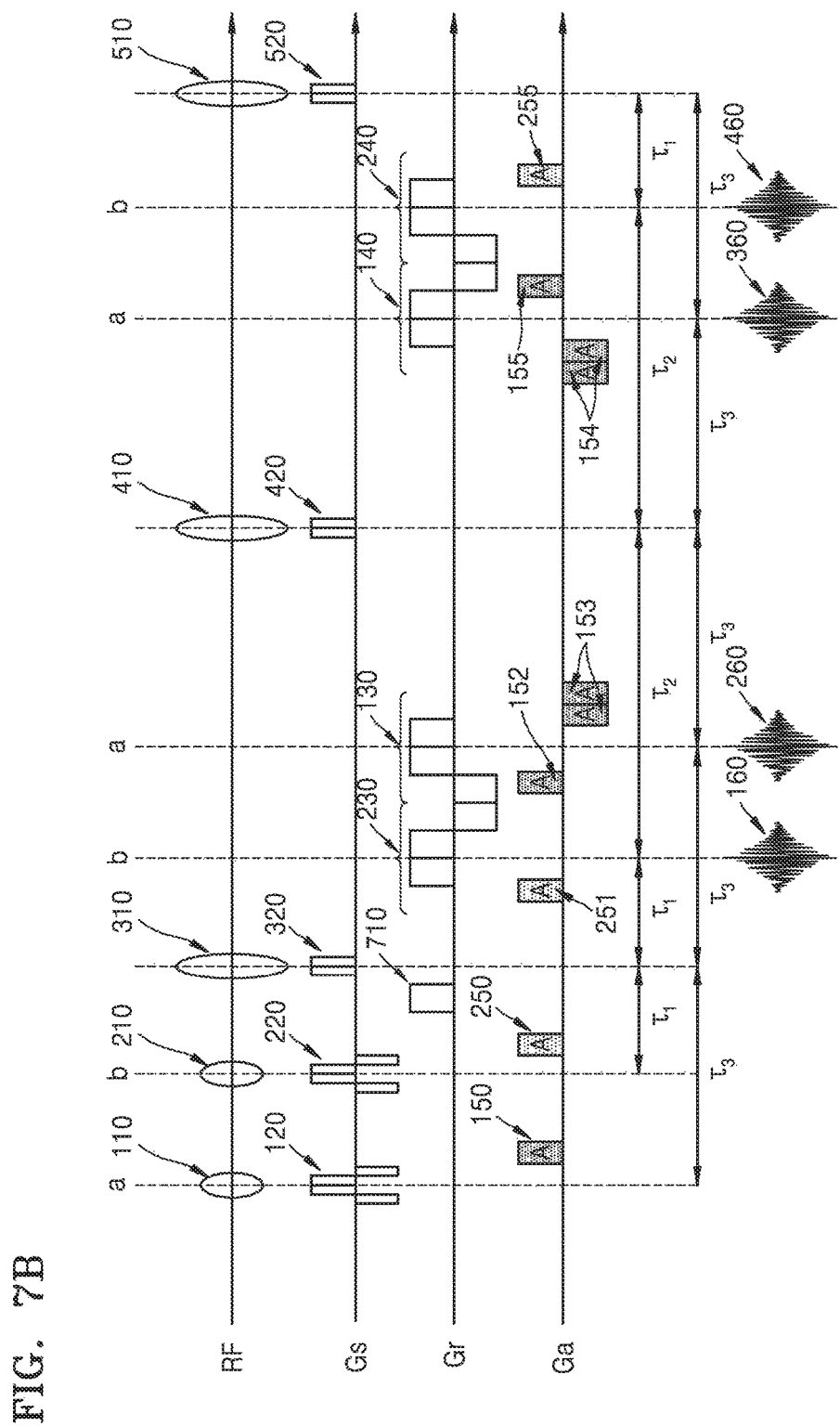

FIGS. 7A and 7B illustrate sequences modified by adjusting a frequency encoding gradient magnetic field, according to an exemplary embodiment.

Referring to FIG. 7A, a negative gradient magnetic field 230_1 is applied in order to minimize dephasing of spins due to a gradient magnetic field when a spin echo signal 160 reaches its maximum, and may be shifted before a first refocusing RF pulse 310.

Referring to FIG. 7B, a gradient magnetic field 710 obtained after shifting the negative gradient magnetic field 230_1 may have an opposite sign to the negative gradient magnetic field 230_1 due to the first refocusing RF pulse 310.

Referring back to FIG. 7A, gradient magnetic fields 130_1 and 140_1 that are applied for adjusting a phase of spins before and after a second refocusing RF pulse 410 may cancel each other out because the gradient magnetic fields 130_1 and 140_1 have the same sign and the same area.

By adjusting a frequency encoding gradient magnetic field, the sequence of FIG. 7A may be modified as shown in FIG. 7B.

Figure 8A:
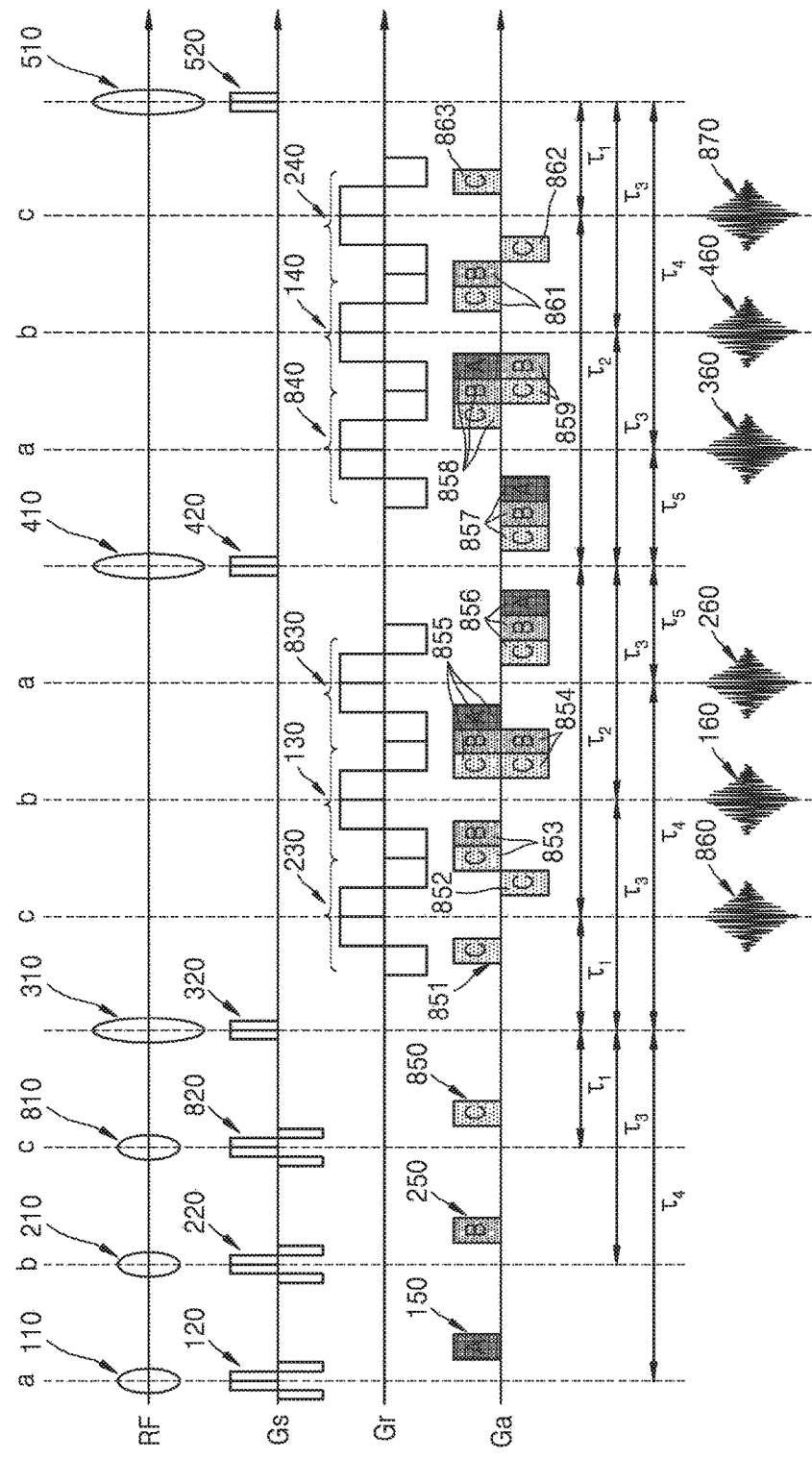
FIGS. 8A through 8C illustrate pulse sequence schematic diagrams of pulse sequences for acquiring an MR signal by using three (3) consecutive excitation RF pulses and additional gradient magnetic fields, according to an exemplary embodiment.
Figure 8B:
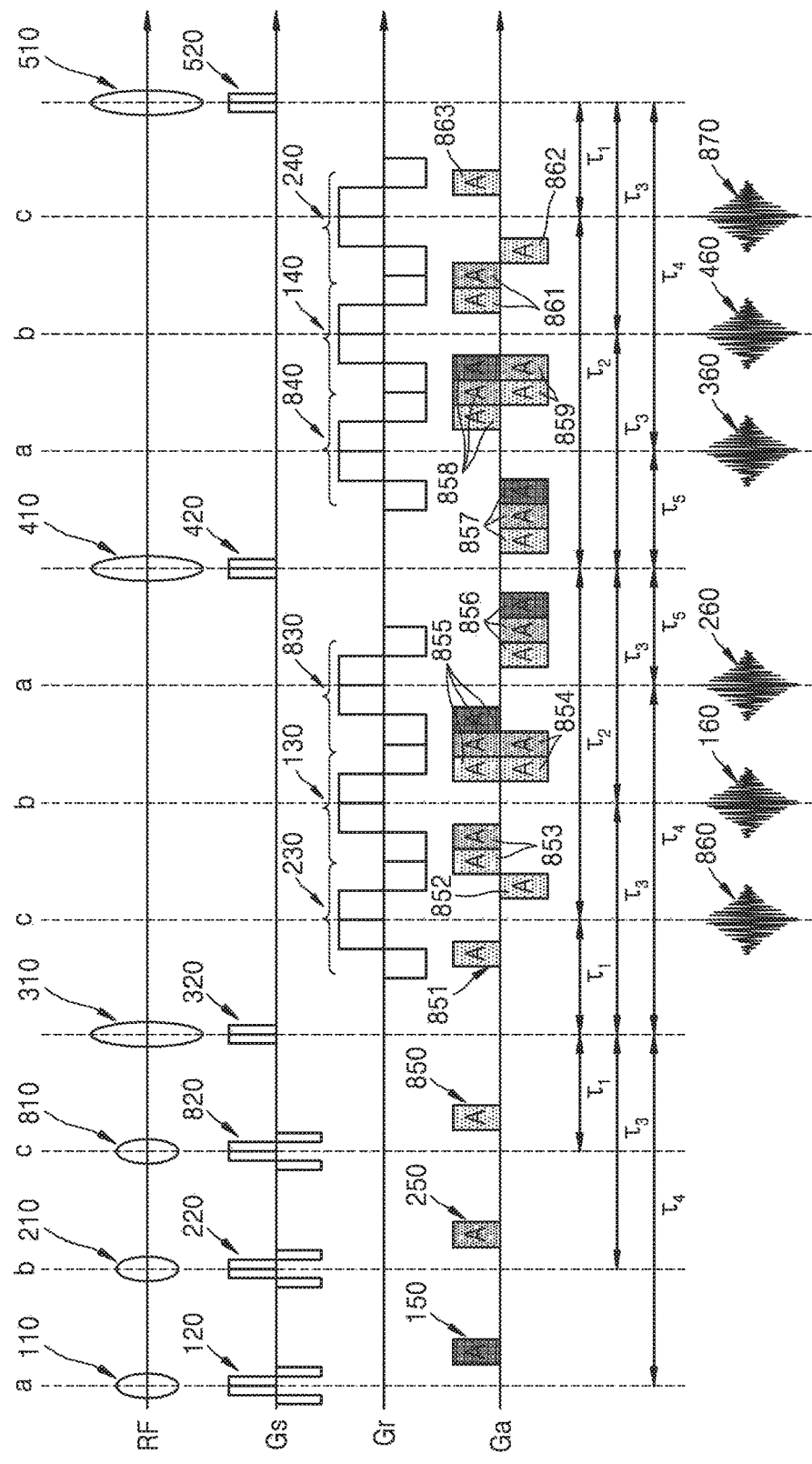
Figure 8C:
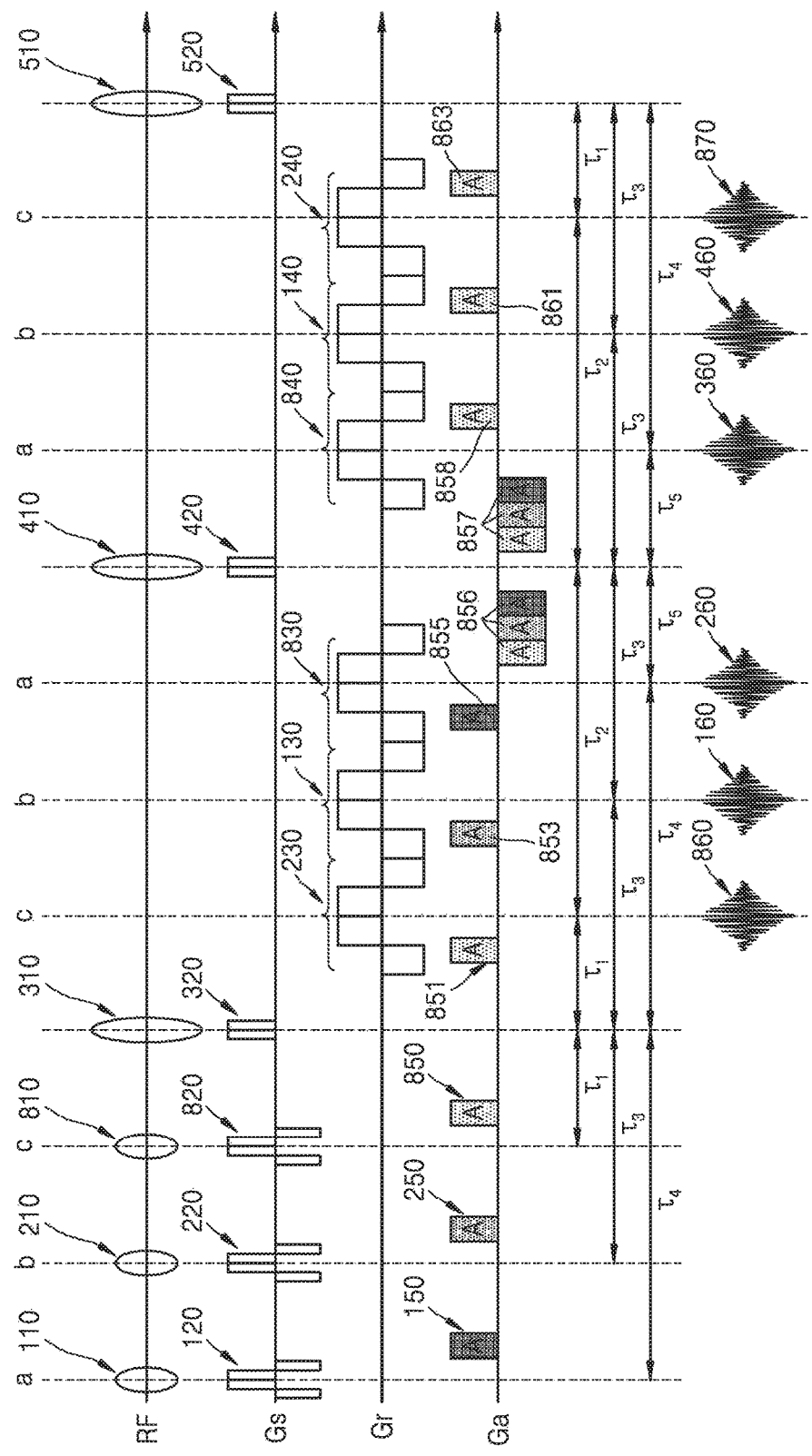

FIGS. 8A through 8C are pulse sequence schematic diagrams for pulse sequences for acquiring an MR signal by using three (3) consecutive excitation RF pulses and additional gradient magnetic fields, according to an exemplary embodiment.

Referring to FIGS. 8A through 8C, before applying a first refocusing RF pulse 310 to an object, the MRI apparatus 100 may consecutively apply a excitation RF pulse 110, b excitation RF pulse 210, and c excitation RF pulse 810 to the object.

Furthermore, during application of the three a, b, c excitation RF pulses 110, 210, and 810, the MRI apparatus 100 may respectively apply slice-selection gradient magnetic fields 120, 220, and 820 for selecting a slice of the object.

After the c excitation RF pulse 810 that has been applied to the object is stopped, the MRI apparatus 100 may spoil a FID signal produced by the c excitation RF pulse 810 by applying c_first additional gradient magnetic field 850 to the object.

A first refocusing RF pulse 310 may rephase spins dephased after the a and b excitation RF pulses 110 and 210 simultaneously with spins dephased after the c excitation RF pulse 810. For example, the first refocusing RF pulse 310 may form spin echo sequences respectively with the a and b excitation RF pulses 110 and 210 while simultaneously forming a spin echo sequence with the c excitation RF pulse 810.

Following application of the first refocusing RF pulse 310, the MRI apparatus 100 may apply c_second additional gradient magnetic field 851 in order to acquire a fifth spin echo signal 860 resulting from the c excitation RF pulse 810. The c_second additional gradient magnetic fields 851 may be a gradient magnetic field having the same sign and the same area as c_first additional gradient magnetic field 850.

Spins that form transverse magnetization due to the c excitation RF pulse 810 may be dephased by the c_first additional gradient magnetic field 850, and the first refocusing RF pulse 310 may invert a phase of the dephased spins by 180 degrees (i.e., changing the sign of the phase). The resulting spins may be rephased again by applying the c_second additional gradient magnetic field 851.

After the spins are rephased by the c_second additional gradient magnetic field 851, the fifth spin echo signal 860 may be generated which corresponds to a spoiled FID signal produced by the c excitation RF pulse 810.

Following the acquisition of the fifth spin echo signal 860, c_third additional gradient magnetic field 852 having the same area as, but an opposite sign to, the c_second additional gradient magnetic field 851 may be applied to the object in order to spoil again the fifth spin echo signal 860.

After the c_third additional gradient magnetic field 852 is stopped, the MRI apparatus 100 may apply b_second additional gradient magnetic field 853 to the object in order to acquire an echo signal resulting from the b excitation RF pulse 210. In this case, an area of the b_second additional gradient magnetic field 853 may be the sum of areas of the c_first additional gradient magnetic field 850 and the b_first additional gradient magnetic field 250. Spins which form transverse magnetization due to the b excitation RF pulse 210 may be dephased by the b_first additional gradient magnetic field 250 and the c_first additional gradient magnetic field 850, and the first refocusing RF pulse 310 may change a phase of the dephased spins by 180 degrees (i.e., changing the sign of the phase). The resulting spins may be rephased again by applying the b_second additional gradient magnetic field 853.

After the spins are rephased by the b_second additional gradient magnetic field 853, a first spin echo signal 160 may be generated which corresponds to a spoiled FID signal produced by the b excitation RF pulse 210.

Following the acquisition of the first spin echo signal 160, the MRI apparatus 100 may apply b_third additional gradient magnetic field 854 having the same area as, but an opposite sign to, the b_second additional gradient magnetic field 853 to the object in order to spoil again the first spin echo signal 160.

After the b_third additional gradient magnetic field 854 is stopped, the MRI apparatus 100 may apply a_second additional gradient magnetic field 855 to the object in order to acquire an echo signal resulting from the a excitation RF pulse 110. In this case, an area of the a_second additional gradient magnetic field 855 may be the sum of areas of the c_first additional gradient magnetic field 850, the b_first additional gradient magnetic field 250, and the a_first additional gradient magnetic field 150. Spins which form transverse magnetization due to the a excitation RF pulse 110 may be dephased by the a_first additional gradient magnetic field 150, the b_first additional gradient magnetic field 250, and the c_first additional gradient magnetic field 850, and the first refocusing RF pulse 310 may invert a phase of the dephased spins by 180 degrees (i.e., changing the sign of the phase). The resulting spins may be rephased again by applying a_second additional gradient magnetic field 855.

After the spins are rephased by the a_second additional gradient magnetic field 855, a second spin echo signal 260 may be generated which corresponds to a spoiled FID signal produced by the a excitation RF pulse 110.

Following the acquisition of the second spin echo signal 260, the MRI apparatus 100 may apply a_third additional gradient magnetic field 856 having the same area as, but an opposite sign to, the a_second additional gradient magnetic field 855 to the object in order to spoil again the second spin echo signal 260.

Similarly, after applying a second refocusing RF pulse 410, the MRI apparatus 100 may generate third, fourth, and sixth spin echo signals 360, 460, and 870 by applying additional gradient magnetic fields 857, 858, 859, 861, 862, and 863.

Referring to FIG. 8B, the MRI apparatus 100 may respectively set areas of additional gradient magnetic fields to be equal to a unit area A or multiples of the unit area A. For example, areas of a_first additional gradient magnetic field 150, b_1 additional gradient magnetic field 250, and c_1 additional gradient magnetic field 850 may each be set to be equal to the unit area A.

Referring to FIG. 8C, by setting areas of additional gradient magnetic fields to be equal to the unit area A or multiples thereof, the MRI apparatus 100 may cancel out gradient magnetic fields having opposite signs during the same interval.

Figure 9A:
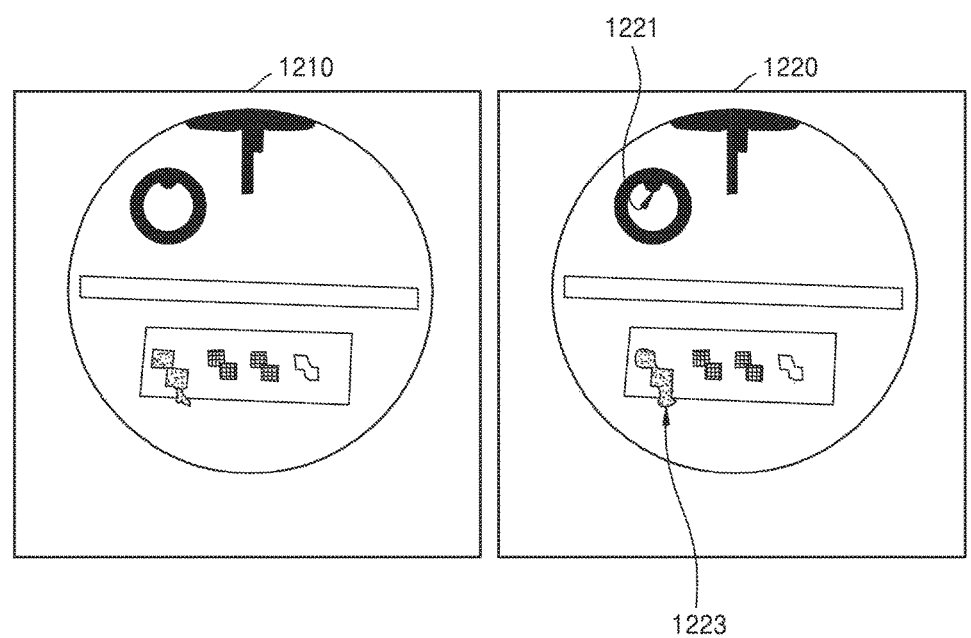
FIGS. 9A through 9C illustrate examples wherein an MR image is generated based on consecutive spin echo signals generated by a sequence, according to an exemplary embodiment.
Figure 9B:
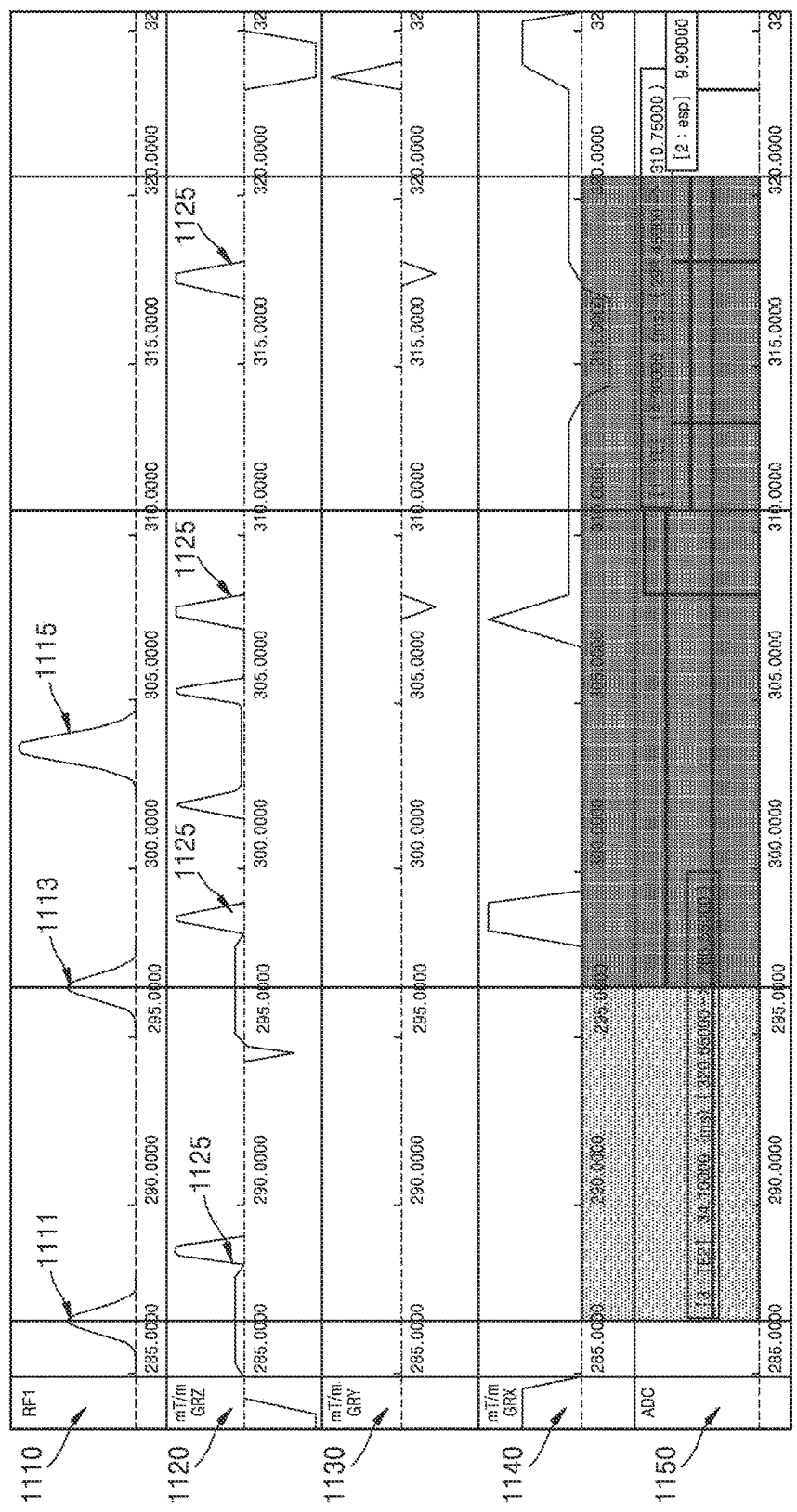
Figure 9C:
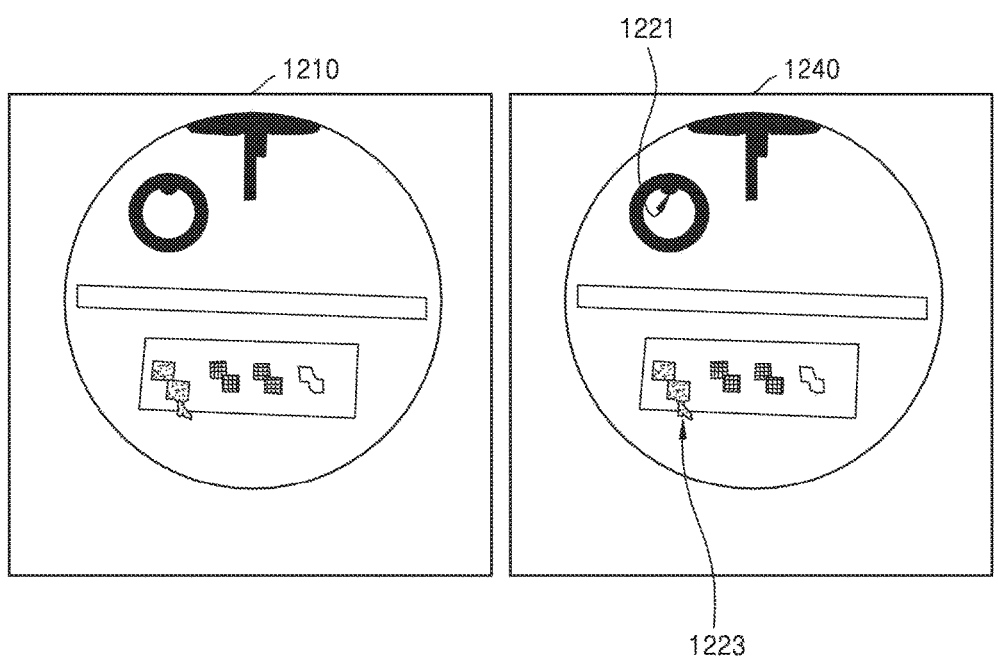

FIGS. 9A through 9C illustrate examples where an MR image is generated based on consecutive spin echo signals generated by a sequence, according to an exemplary embodiment.

Referring to FIG. 9A, a first MR image 1210 may be an MR image captured using a spin echo sequence according to an exemplary embodiment.

A second MR image 1220 may be an MR image captured using a general GRASE sequence. Due to a greater sensitivity of gradient echoes to magnetic susceptibility, portions in the second MR image 1220 may be distorted when compared to the first MR image 1210.

Referring to FIG. 9B, the MRI apparatus 100 may generate an MR image based on consecutive spin echo signals produced by applying two consecutive excitation RF pulses 1111 and 1113, a refocusing pulse 1115, and additional gradient magnetic fields 1125 to an object.

First through fifth rows in FIG. 9B respectively represent an RF pulse applied to an object, a slice-selection gradient magnetic field 1120, a phase encoding gradient magnetic field 1130, a frequency encoding gradient magnetic field 1140, and an analog-to-digital (ADC) signal.

The MRI apparatus 100 may apply the two consecutive excitation RF pulses 1111 and 1113 to the object. Furthermore, the MRI apparatus 100 may add the additional gradient magnetic fields 1125 to the slice-selection gradient magnetic field 1120 and apply the resultant gradient magnetic field to the object.

Referring to FIG. 9C, a third MR image 1240 may be an MR image of the object shown in FIG. 9A captured using the sequence of FIG. 9B.

By comparing the second MR image 1220 of FIG. 9A with the third MR image 1240 of FIG. 9C, it can be seen that distortion does not occur in portions 1221 and 1223 in the third MR image 1240 corresponding to the distorted portions 1221 and 1223 in the second MR image 1220.

Thus, use of a sequence according to an exemplary embodiment may allow acquisition of more echoes within the same time period than in the case of a general spin echo sequence. Furthermore, because all data for an MR image can be acquired from spin echoes, it is possible to obtain a more accurate MR image.

Figure 10:
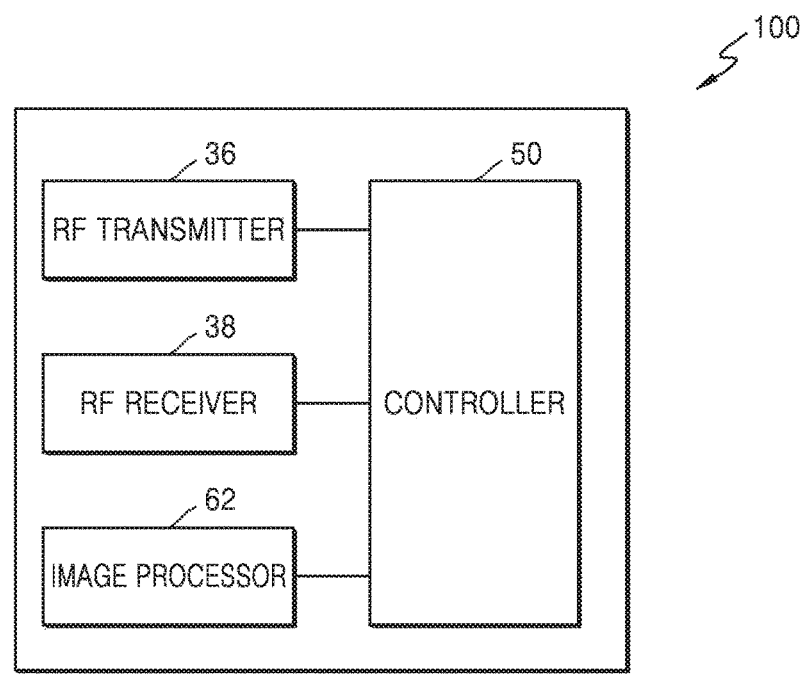
FIG. 10 is a block diagram of an MRI apparatus according to an exemplary embodiment.

FIG. 10 is a block diagram of the MRI apparatus 100 according to an exemplary embodiment.

Referring to FIG. 10, the MRI apparatus 100 according to the present exemplary embodiment may include an RF transmitter 36, an RF receiver 38, a controller 50, and an image processor 62.

The controller 50 may control the MRI apparatus 100 in its entirety. For example, the controller 50 may control the MRI apparatus 100 in its entirety based on an MRI pulse sequence set by the user.

The RF transmitter 36 may apply an excitation RF pulse and a refocusing RF pulse to an object according to control by the controller 50. For example, the RF transmitter 36 may apply a refocusing RF pulse after a plurality of excitation RF pulses within a TR period.

The RF transmitter 36 may apply a plurality of excitation RF pulses having different flip angles to the object. For example, the RF transmitter may apply excitation RF pulses having different strengths to the object or apply the excitation RF pulses at different times.

The RF transmitter 36 may apply a plurality of excitation RF pulses to the object so that the excitation RF pulses excite the same slice of the object. For example, the RF transmitter 36 may apply a plurality of excitation RF pulses having the same frequency to the object.

The MRI apparatus 100 may include a gradient magnetic field amplifier. The gradient magnetic field amplifier may apply a slice-selection gradient magnetic field, a phase encoding gradient magnetic field, and a frequency encoding gradient magnetic field to the object according to control by the controller 50.

The controller 50 may control the gradient magnetic field amplifier so that first additional gradient magnetic fields respectively corresponding to a plurality of excitation RF pulses are applied to the object. As the first additional gradient magnetic fields are respectively applied to the object, FID signals respectively produced by the plurality of excitation RF pulses may be spoiled.

Furthermore, the controller 50 may control the gradient magnetic field amplifier so that second additional gradient magnetic fields respectively corresponding to the plurality of excitation RF pulses are applied to the object after a refocusing RF pulse. By applying the second additional gradient magnetic fields respectively corresponding to the plurality of excitation RF pulses to the object, spin echo signals respectively corresponding to the spoiled FID signals may be generated.

The RF receiver 38 may receive an RF echo signal emitted from the object according to control by the controller 50. For example, the RF receiver 38 may acquire a generated spin echo signal.

The controller 50 may determine an area of a first additional gradient magnetic field based on at least one of a thickness of a slice of the object excited by the plurality of excitation RF pulse and a magnitude of a FID signal.

The controller 50 may add the first and second additional gradient magnetic fields to at least one of a slice-selection gradient magnetic field, a phase encoding gradient magnetic field, and a frequency encoding gradient magnetic field.

When the plurality of excitation RF pulses include a and b excitation RF pulses and the first additional gradient magnetic fields include a_first additional gradient magnetic field and b_first additional gradient magnetic field respectively corresponding to the a and b excitation RF pulses, the controller 50 may control the gradient magnetic field amplifier so that the a_first additional gradient magnetic field and the b_first additional gradient magnetic field have different areas.

After acquisition of a spin echo signal, the controller 50 may control the gradient magnetic field amplifier so that a gradient magnetic field having the same area as, but an opposite sign to, a second additional gradient magnetic field is applied to the object. As the gradient magnetic field having the same area as, but an opposite sign to, the second additional gradient magnetic field is applied to the object, the generated spin echo signal may be spoiled again.

The image processor 62 may acquire one k-space based on spin echo signals respectively corresponding to FID signals respectively produced by a plurality of excitation RF pulses and obtain an MR image of an object based on the acquired k-space.

Furthermore, the image processor 62 may acquire a plurality of k-spaces based on spin echo signals respectively corresponding to FID signals respectively produced by a plurality of excitation RF pulses and obtain MR images of an object respectively corresponding to the acquired k-spaces.

Furthermore, the image processor 62 may obtain a single MR image by combining together the obtained MR images of the object.

Figure 11:
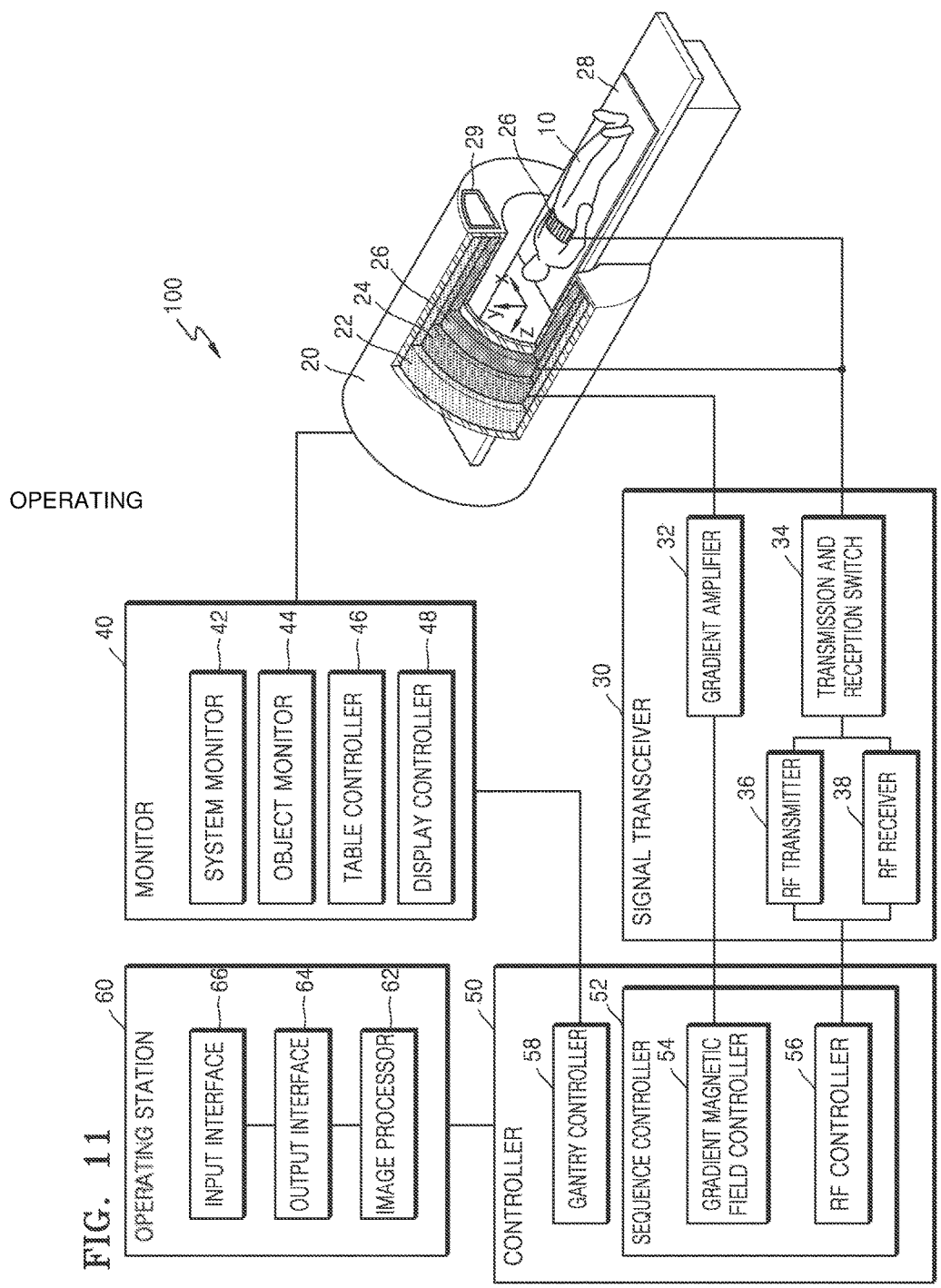
FIG. 11 is a schematic diagram of an MRI apparatus according to another exemplary embodiment.

FIG. 11 is a schematic diagram of an MRI apparatus 100 according to another exemplary embodiment.

Referring to FIG. 11, the MRI apparatus 100 according to the exemplary embodiment of FIG. 11 may include a signal transceiver 30 including the RF transmitter 36 and the RF receiver 38, an operating station 60 including the image processor 62, a gantry 20, and a monitor 40.

The gantry 20 prevents external emission of electromagnetic waves generated by a main magnet 22, a gradient coil 24, and an RF coil 26. A magnetostatic field and a gradient are formed in a bore in the gantry 20, and an RF signal is emitted toward an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being strong and uniform.

The gradient coil 24 includes X, Y, and Z coils for generating gradients in X-, Y-, and Z-axis directions crossing each other at right angles. The gradient coil 24 may provide location information of each region of the object 10 by differently inducing resonance frequencies according to the regions of the object 10.

The RF coil 26 may emit an RF signal toward a patient and receive an MR signal emitted from the patient. In detail, the RF coil 26 may transmit, toward atomic nuclei included in the patient and having precessional motion, an RF signal having the same frequency as that of the precessional motion, stop transmitting the RF signal, and then receive an MR signal emitted from the atomic nuclei included in the patient.

For example, in order to transit an atomic nucleus from a low energy state to a high energy state, the RF coil 26 may generate and apply an electromagnetic wave signal that is an RF signal corresponding to a type of the atomic nucleus, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves having a Lamor frequency.

In other words, when the applying of the electromagnetic wave signal to the atomic nucleus is stopped, an energy level of the atomic nucleus is changed from a high energy level to a low energy level, and thus the atomic nucleus may emit electromagnetic waves having a Lamor frequency. The RF coil 26 may receive electromagnetic wave signals from atomic nuclei included in the object 10.

The RF coil 26 may be realized as one RF transmitting and receiving coil having both a function of generating electromagnetic waves each having an RF that corresponds to a type of an atomic nucleus and a function of receiving electromagnetic waves emitted from an atomic nucleus. Alternatively, the RF coil 26 may be realized as a transmission RF coil having a function of generating electromagnetic waves each having an RF that corresponds to a type of an atomic nucleus, and a reception RF coil having a function of receiving electromagnetic waves emitted from an atomic nucleus.

The RF coil 26 may be fixed to the gantry 20 or may be detachable. When the RF coil 26 is detachable, the RF coil 26 may be an RF coil for a part of the object, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may be a birdcage coil, a surface coil, or a transverse electromagnetic (TEM) coil according to structures.

The RF coil 26 may be a transmission exclusive coil, a reception exclusive coil, or a transmission and reception coil according to methods of transmitting and receiving an RF signal.

The RF coil 26 may be an RF coil having various numbers of channels, such as 16 channels, 32 channels, 72 channels, and 144 channels.

The gantry 20 may further include a display 29 disposed outside the gantry 20 and a display disposed inside the gantry 20. The gantry 20 may provide predetermined information to the user or the object 10 through the display 29 and the display respectively disposed outside and inside the gantry 20.

The signal transceiver 30 may control the gradient formed inside the gantry 20, i.e., in the bore, according to a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 included in the gantry 20, and may supply a pulse signal for generating a gradient to the gradient coil 24 under the control of a gradient magnetic field controller 54. By controlling the pulse signal supplied from the gradient amplifier 32 to the gradient coil 24, gradients in X-, Y-, and Z-axis directions may be synthesized.

The RF transmitter 36 and the RF receiver 38 may drive the RF coil 26. The RF transmitter 36 may supply an RF pulse in a Lamor frequency to the RF coil 26, and the RF receiver 38 may receive an MR signal received by the RF coil 26.

The transmission and reception switch 34 may adjust transmitting and receiving directions of the RF signal and the MR signal. For example, the transmission and reception switch 34 may emit the RF signal toward the object 10 through the RF coil 26 during a transmission mode, and receive the MR signal from the object 10 through the RF coil 26 during a reception mode. The transmission and reception switch 34 may be controlled by a control signal output by an RF controller 56.

The monitor 40 may monitor or control the gantry 20 or devices mounted on the gantry 20. The monitor 40 may include a system monitor 42, an object monitor 44, a table controller 46, and a display controller 48.

The system monitor 42 may monitor and control a state of the magnetostatic field, a state of the gradient, a state of the RF signal, a state of the RF coil 26, a state of the table 28, a state of a device measuring body information of the object 10, a power supply state, a state of a thermal exchanger, and a state of a compressor.

The object monitor 44 monitors a state of the object 10. In detail, the object monitor 44 may include a camera for observing a movement or position of the object 10, a respiration measurer for measuring the respiration of the object 10, an electrocardiogram (ECG) measurer for measuring the electrical activity of the object 10, or a temperature measurer for measuring a temperature of the object 10.

The table controller 46 controls a movement of the table 28 where the object 10 is positioned. The table controller 46 may control the movement of the table 28 according to a sequence control of a sequence controller 50. For example, during moving imaging of the object 10, the table controller 46 may continuously or discontinuously move the table 28 according to the sequence control of the sequence controller 50, and thus the object 10 may be photographed in a field of view (FOV) larger than that of the gantry 20.

The display controller 48 controls the display 29 disposed outside the gantry 20 and the display disposed inside the gantry 20. In detail, the display controller 48 may control the display 29 and the display to be on or off, and may control a screen image to be output on the display 29 and the display. Also, when a speaker is located inside or outside the gantry 20, the display controller 48 may control the speaker to be on or off, or may control sound to be output via the speaker.

The controller 50 may include the sequence controller 52 for controlling a sequence of signals formed in the gantry 20, and a gantry controller 58 for controlling the gantry 20 and the devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operating station 60. Here, the pulse sequence includes all information required to control the gradient amplifier 32, the RF transmitter 36, the RF receiver 38, and the transmission and reception switch 34. For example, the pulse sequence may include information about a strength, an application time, and application timing of a pulse signal applied to the gradient coil 24.

The operating station 60 may request the controller 50 to transmit pulse sequence information while controlling an overall operation of the MRI apparatus 100.

The operating station 60 may include an image processor 62 for receiving and processing the MR signal received by the RF receiver 38, an output interface 64, and an input interface 66.

The image processor 62 may process the MR signal received from the RF receiver 38 so as to generate MR image data of the object 10.

The image processor 62 receives the MR signal received by the RF receiver 38 and performs any one of various signal processes, such as amplification, frequency transformation, phase detection, low frequency amplification, and filtering, on the received MR signal.

The image processor 62 may arrange digital data in a k space (for example, also referred to as a Fourier space or a frequency space) of a memory, and rearrange the digital data into image data via 2D or 3D Fourier transformation.

If needed, the image processor 62 may perform a composition process or difference calculation process on the image data. The composition process may be an addition process performed on a pixel or a maximum intensity projection (MIP) process performed on a pixel. The image processor 62 may store not only the rearranged image data but also image data on which a composition process or a difference calculation process is performed, in a memory or an external server.

The image processor 62 may perform any of the signal processes on the MR signal in parallel. For example, the image processor 62 may perform a signal process on a plurality of MR signals received by a multi-channel RF coil in parallel so as to rearrange the plurality of MR signals into image data.

The output interface 64 may output image data generated or rearranged by the image processor 62 to the user. The output interface 64 may also output information required for the user to manipulate the MRI apparatus 100, such as a user interface (UI), user information, or object information. The output interface 64 may be a speaker, a printer, a cathode-ray tube (CRT) display, a liquid crystal display (LCD), a plasma display panel (PDP), an organic light-emitting device (OLED) display, a field emission display (FED), a light-emitting diode (LED) display, a vacuum fluorescent display (VFD), a digital light processing (DLP) display, a flat panel display (FPD), a 3-dimensional (3D) display, a transparent display, or any one of other various output devices that are well known to one of ordinary skill in the art.

The user may input object information, parameter information, a scan condition, a pulse sequence, or information about image composition or difference calculation by using the input interface 66. The input interface 66 may be a keyboard, a mouse, a track ball, a voice recognizer, a gesture recognizer, a touch screen, or any one of other various input devices that are well known to one of ordinary skill in the art.

The signal transceiver 30, the monitor 40, the controller 50, and the operating station 60 are separate components in FIG. 11, but it will be obvious to one of ordinary skill in the art that respective functions of the signal transceiver 30, the monitor 40, the controller 50, and the operating station 60 may be performed by another component. For example, the image processor 62 converts the MR signal received from the RF receiver 38 into a digital signal in FIG. 1, but alternatively, the conversion of the MR signal into the digital signal may be performed by the RF receiver 38 or the RF coil 26.

The gantry 20, the RF coil 26, the signal transceiver 30, the monitor 40, the controller 50, and the operating station 60 may be connected to each other by wire or wirelessly, and when they are connected wirelessly, the MRI system may further include an apparatus for synchronizing clock signals therebetween. Communication between the gantry 20, the RF coil 26, the signal transceiver 30, the monitor 40, the controller 50, and the operating station 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), optical communication, or any of other various communication methods that are well known to one of ordinary skill in the art.

Figure 12:
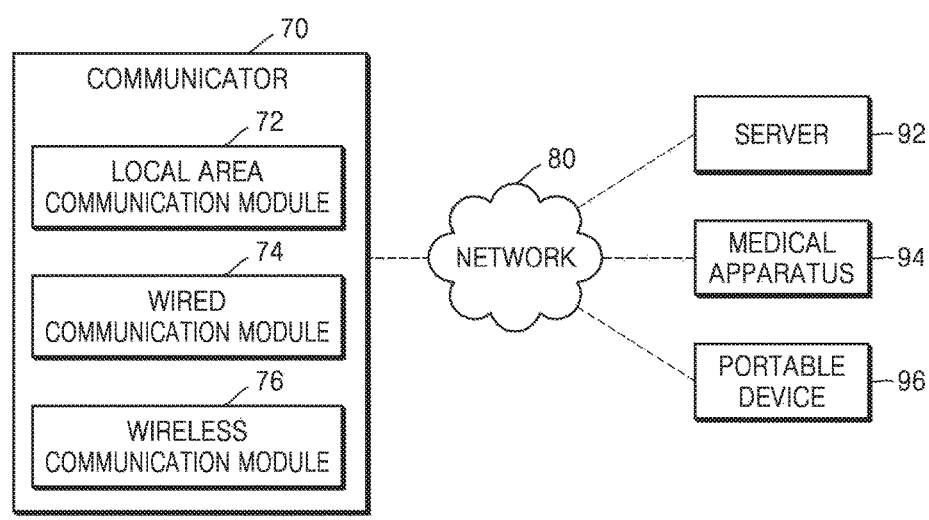
FIG. 12 is a block diagram of a configuration of a communicator according to an exemplary embodiment.

FIG. 12 is a block diagram of a communicator 70 according to an exemplary embodiment.

Referring to FIG. 12, the communicator 70 may be connected to at least one selected from the gantry 20, the signal transceiver 30, the monitor 40, the controller 50, and the operating station 60 of FIG. 11.

The communicator 70 may transmit and receive data to and from a hospital server or another medical apparatus in a hospital, which is connected through a picture archiving and communication system (PACS), and perform data communication according to the digital imaging and communications in medicine (DICOM) standard.

As shown in FIG. 12, the communicator 70 may be connected to a network 80 by wire or wirelessly to communicate with a server 92, a medical apparatus 94, or a portable device 96.

In detail, the communicator 70 may transmit and receive data related to the diagnosis of an object through the network 80, and may also transmit and receive a medical image captured by the medical apparatus 94, such as a CT apparatus, an MRI apparatus, or an X-ray apparatus. In addition, the communicator 70 may receive a diagnosis history or a treatment schedule of the object from the server 92 and use the same to diagnose the object. The communicator 70 may perform data communication not only with the server 92 or the medical apparatus 94 in a hospital, but also with the portable device 96, such as a mobile phone, a personal digital assistant (PDA), or a laptop of a doctor or patient.

Also, the communicator 70 may transmit information about a malfunction of the MRI system or about a medical image quality to a user through the network 80, and receive a feedback regarding the information from the user.

The communicator 70 may include at least one component enabling communication with an external apparatus.

For example, the communicator 70 may include a local area communication module 72, a wired communication module 74, and a wireless communication module 76. The local area communication module 72 refers to a module for performing local area communication with an apparatus within a predetermined distance. Examples of local area communication technology according to an exemplary embodiment include, but are not limited to, a wireless local area network (LAN), Wi-Fi, Bluetooth, ZigBee, Wi-Fi direct (WFD), ultra wideband (UWB), infrared data association (IrDA), Bluetooth low energy (BLE), and near field communication (NFC).

The wired communication module 74 refers to a module for performing communication by using an electric signal or an optical signal. Examples of wired communication technology according to an exemplary embodiment include wired communication techniques using a pair cable, a coaxial cable, and an optical fiber cable, and other well known wired communication techniques.

The wireless communication module 76 transmits and receives a wireless signal to and from at least one selected from a base station, an external apparatus, and a server in a mobile communication network. Here, the wireless signal may be a voice call signal, a video call signal, or data in any one of various formats according to transmission and reception of a text/multimedia message.

The above-described exemplary embodiments of the present disclosure may be written as computer programs and may be implemented in general-use digital computers that execute the programs using a computer-readable recording medium.

Examples of the computer-readable recording medium include magnetic storage media (e.g., ROM, floppy disks, hard disks, etc.), optical recording media (e.g., CD-ROMs, or DVDs), etc.

While one or more exemplary embodiments have been described with reference to the figures, it will be understood by those of ordinary skill in the art that various changes in form and details may be made therein without departing from the spirit and scope as defined by the following claims. Accordingly, the above exemplary embodiments and all aspects thereof are examples only and are not limiting.

Exemplary embodiments may be implemented through non-transitory computer-readable recording media having recorded thereon computer-executable instructions such as program modules that are executed by a computer. The non-transitory computer-readable recording media may be any available media that can be accessed by a computer and include both volatile and nonvolatile media and both detachable and non-detachable media. Furthermore, the non-transitory computer-readable recording media may include computer storage media and communication media. The computer storage media include both volatile and nonvolatile and both detachable and non-detachable media implemented by any method or technique for storing information such as computer-readable instructions, data structures, program modules, or other data. The communication media typically embody computer-readable instructions, data structures, program modules, other data of a modulated data signal, or other transmission mechanism, and may include any information transmission media.

Also, in the present specification, the term "unit" may mean a hardware component such as a processor or circuit and/or a software component executed by the hardware component such as a processor.

The above description is provided for illustration, and it will be understood by those of ordinary skill in the art that various changes in form and details may be made therein without departing from essential features and the spirit and scope as defined by the following claims. Accordingly, the above exemplary embodiments and all aspects thereof are examples only and are not limiting. For example, each component defined as an integrated component may be implemented in a distributed fashion. Likewise, components defined as separate components may be implemented in an integrated manner.

The scope is defined not by the detailed description thereof but by the appended claims, and all the changes or modifications of the appended claims and their equivalents will be construed as being included in the scope.

What is claimed is:

1. A magnetic resonance imaging (MRI) apparatus comprising:
   a radio frequency (RF) transmitter configured to transmit a plurality of excitation RF pulses to an object, and to transmit a refocusing RF pulse to the object within a repetition time (TR) period after transmitting the plurality of excitation RF pulses;
   a controller configured to:
      control the RF transmitter to transmit to the object a plurality of first additional gradient magnetic fields corresponding to the plurality of excitation RF pulses in order to spoil a plurality of free induction decay (FID) signals produced by the plurality of excitation RF pulses, and
      control the RF transmitter to transmit to the object a plurality of second additional gradient magnetic fields corresponding to the plurality of excitation RF pulses in order to generate a plurality of spin echo signals corresponding to the spoiled plurality of FID signals after transmitting the refocusing RF pulse; and
   an RF receiver configured to acquire the generated plurality of spin echo signals,
   wherein the plurality of first additional gradient magnetic fields include a_first additional gradient magnetic field for spoiling a first FID signal resulting from an a_excitation RF pulse and b_first additional gradient magnetic field for spoiling a second FID signal resulting from a b_excitation RF pulse, and
   wherein the a_first additional gradient magnetic field has a first area, and the b_first additional gradient magnetic field has a second area different from the first area.

2. The MRI apparatus of claim 1, wherein the plurality of excitation RF pulses have a plurality of flip angles.

3. The MRI apparatus of claim 1, wherein the plurality of excitation RF pulses excite a same slice of the object.

4. The MRI apparatus of claim 1, wherein an area of each of the plurality of first additional gradient magnetic fields is determined based on at least one from among a thickness of a slice of the object, the slice being excited by the plurality of excitation RF pulses, and a magnitude of each of the FID signals.

5. The MRI apparatus of claim 1, wherein the plurality of first additional gradient magnetic fields and the plurality of second additional gradient magnetic fields are added to at least one from among a slice-selection gradient magnetic field, a phase encoding gradient magnetic field, and a frequency encoding gradient magnetic field.

6. The MRI apparatus of claim 1, wherein, after acquiring the plurality of spin echo signals, the controller is further configured to control the RF transmitter to transmit a gradient magnetic field having a same area as each of the plurality of second additional gradient magnetic fields, wherein the gradient magnetic field has an opposite sign to each of the plurality of second additional gradient magnetic fields, in order to spoil each of the plurality of spin echo signals.

7. The MRI apparatus of claim 1, wherein the controller is further configured to acquire a k-space based on the plurality of spin echo signals corresponding to the plurality of FID signals produced by the plurality of excitation RF pulses, and to obtain an MR image of the object based on the acquired k-space.

8. The MRI apparatus of claim 1, wherein the controller is further configured to acquire a plurality of k-spaces based on the plurality of spin echo signals corresponding to the plurality of FID signals produced by the plurality of excitation RF pulses, and to obtain a plurality of MR images of the object corresponding to the acquired plurality of k-spaces.

9. The MRI apparatus of claim 8, wherein the controller is further configured to obtain an image of the object by combining the obtained plurality of MR images of the object.

10. A method of acquiring a spin echo signal, the method comprising:
   transmitting a plurality of excitation RF pulses to an object;

applying a refocusing radio frequency (RF) pulse to the object within a repetition time (TR) period after transmitting the plurality of excitation RF pulses;

transmitting to the object a plurality of first additional gradient magnetic fields corresponding to the plurality of excitation RF pulses in order to spoil a plurality of free induction decay (FID) signals produced by the plurality of excitation RF pulses, by; and transmitting to the object a plurality of second additional gradient magnetic fields corresponding to the plurality of excitation RF pulses in order to generate a plurality of spin echo signals corresponding to the spoiled plurality of FID signals after transmitting the refocusing RF pulse, wherein the plurality of first additional gradient magnetic fields include a_first additional gradient magnetic field for spoiling a first FID signal resulting from an a_excitation RF pulse and b_first additional gradient magnetic field for spoiling a second FID signal resulting from a b_excitation RF pulse, and wherein the a_first additional gradient magnetic field has a first area, and the b_first additional gradient magnetic field has a second area different from the first area.

11. The method of claim 10, wherein the plurality of excitation RF pulses have a plurality of flip angles.

12. The method of claim 10, wherein the plurality of excitation RF pulses excite a same slice of the object.

13. The method of claim 10, wherein an area of each of the plurality of first additional gradient magnetic fields is determined based on at least one from among a thickness of a slice of the object, the slice being excited by the plurality of excitation RF pulses, and a magnitude of each of the FID signals.

14. The method of claim 10, wherein the plurality of first additional gradient magnetic fields and the plurality of second additional gradient magnetic fields are added to at least one from among a slice-selection gradient magnetic field, a phase encoding gradient magnetic field, and a frequency encoding gradient magnetic field.

15. The method of claim 10, further comprising, after the generating of the plurality of spin echo signals, transmitting a gradient magnetic field having a same area as each of the plurality of second additional gradient magnetic fields, wherein the gradient magnetic field has an opposite sign to each of the plurality of second additional gradient magnetic fields, in order to spoil each of the plurality of spin echo signals.

16. The method of claim 10, further comprising:
acquiring a k-space based on the plurality of spin echo signals corresponding to the plurality of FID signals produced by the plurality of excitation RF pulses; and
obtaining an MR image of the object based on the acquired k-space.

17. The method of claim 10, further comprising:
acquiring a plurality of k-spaces based on the plurality of spin echo signals corresponding to the plurality of FID signals produced by the plurality of excitation RF pulses; and
obtaining a plurality of MR images of the object corresponding to the acquired plurality of k-spaces.

18. The method of claim 17, further comprising obtaining an image of the object by combining the obtained plurality of MR images of the object.

* * * * *